(12) United States Patent
Hirase et al.

(10) Patent No.: US 10,341,591 B2
(45) Date of Patent: Jul. 2, 2019

(54) IMAGING DEVICE

(71) Applicant: Panasonic Intellectual Property Management Co., Ltd., Osaka (JP)

(72) Inventors: Junji Hirase, Osaka (JP); Yoshihiro Sato, Osaka (JP); Yoshinori Takami, Toyama (JP); Masayuki Takase, Osaka (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 93 days.

(21) Appl. No.: 15/446,545

(22) Filed: Mar. 1, 2017

(65) Prior Publication Data

US 2017/0264840 A1 Sep. 14, 2017

(30) Foreign Application Priority Data

Mar. 14, 2016 (JP) .................. 2016-049973

(51) Int. Cl.
*H04N 5/359* (2011.01)
*H04N 5/361* (2011.01)
(Continued)

(52) U.S. Cl.
CPC ....... H04N 5/361 (2013.01); H01L 27/14612 (2013.01); H01L 27/14636 (2013.01);
(Continued)

(58) Field of Classification Search
None
See application file for complete search history.

(56) References Cited

U.S. PATENT DOCUMENTS 7,956,394 B2 * 6/2011 Lee .................. H01L 27/14634
257/294
2006/0275990 A1 * 12/2006 Itonaga ............... H01L 29/6656
438/286
(Continued)

FOREIGN PATENT DOCUMENTS

JP 2006-032681 2/2006
JP 2011-071481 4/2011
(Continued)

*Primary Examiner* — Roberto Velez
*Assistant Examiner* — Quan Pham
(74) *Attorney, Agent, or Firm* — McDermott Will & Emery LLP

(57) ABSTRACT

An imaging device includes a semiconductor layer and a pixel cell. The pixel cell includes an impurity region of a first conductivity type, the impurity region located in the semiconductor layer, a photoelectric converter electrically connected to the impurity region and located above the semiconductor layer, a first transistor having a first gate, a first source and a first drain, one of the first source and the first drain electrically connected to the impurity region, a second transistor having a second gate of a second conductivity type different from the first conductivity type, a second source and a second drain, the second transistor including the impurity region as one of the second source and the second drain, the second gate electrically connected to the impurity region, and a third transistor having a third gate, a third source and a third drain, the third gate electrically connected to the photoelectric converter.

12 Claims, 12 Drawing Sheets

(51) Int. Cl.
  *H04N 5/363* (2011.01)
  *H04N 5/369* (2011.01)
  *H01L 27/146* (2006.01)
  *H04N 5/3745* (2011.01)

(52) U.S. Cl.
  CPC ....... *H01L 27/14643* (2013.01); *H04N 5/359* (2013.01); *H04N 5/363* (2013.01); *H04N 5/3698* (2013.01); *H04N 5/3745* (2013.01)

(56) References Cited

U.S. PATENT DOCUMENTS

| | | | |
|---|---|---|---|
| 2008/0225133 A1* | 9/2008 | Takayanagi | H01L 27/14643 348/222.1 |
| 2009/0200455 A1* | 8/2009 | Takayanagi | H01L 27/14643 250/214.1 |
| 2011/0049591 A1 | 3/2011 | Nakatani et al. | |
| 2013/0292548 A1* | 11/2013 | Agranov | H01L 27/14643 250/208.1 |
| 2014/0027618 A1 | 1/2014 | Goto | |
| 2014/0043510 A1 | 2/2014 | Kasuga et al. | |
| 2014/0091368 A1* | 4/2014 | Miyagawa | H01L 27/14603 257/222 |
| 2014/0103400 A1* | 4/2014 | Sakata | H01L 27/1463 257/222 |
| 2015/0076484 A1* | 3/2015 | Moriyama | H01L 27/14665 257/40 |
| 2016/0163759 A1* | 6/2016 | Ahn | H01L 27/14634 257/225 |
| 2017/0194372 A1* | 7/2017 | Ha | H01L 27/14614 |
| 2018/0006073 A1* | 1/2018 | Togashi | H01L 23/481 |
| 2018/0108690 A1* | 4/2018 | Yanagita | H01L 27/14634 |

FOREIGN PATENT DOCUMENTS

| | | |
|---|---|---|
| JP | 2012-151369 | 8/2012 |
| JP | 2012-209342 | 10/2012 |
| WO | 2012/147302 | 11/2012 |

\* cited by examiner

IMAGING DEVICE

BACKGROUND

1. Technical Field

The present disclosure relates to an imaging device.

2. Description of the Related Art

A charge coupled device (CCD) image sensor and a complementary metal oxide semiconductor (CMOS) image sensor are widely used for a digital camera or the like. As widely known, those image sensors have a photodiode that is formed in a semiconductor substrate.

Meanwhile, a structure has been suggested in which a photoelectric conversion unit having a photoelectric conversion layer is arranged above the semiconductor substrate (for example, Japanese Unexamined Patent Application Publication No. 2012-209342). An imaging device that has such a structure may be referred to as a stacked image sensor. In the stacked image sensor, charges produced by photoelectric conversion are stored in a charge storage region (also referred to as "floating diffusion"). Signals in accordance with the charge amount stored in the charge storage region are read out via a CCD circuit or a CMOS circuit that is formed on the semiconductor substrate.

In the stacked image sensor, in a case where the photoelectric conversion layer is irradiated with very high illuminance light, the electric potential of the charge storage region rises, and this may result in damage to a transistor or the like in a circuit for signal detection. Japanese Unexamined Patent Application Publication No. 2012-209342 discloses a circuit in which a protection transistor which inhibits the electric potential of a gate electrode of an output transistor from becoming a prescribed value or higher is provided in a pixel (FIG. 1). In the circuit of FIG. 1 of Japanese Unexamined Patent Application Publication No. 2012-209342, in a case where a photoelectric conversion unit P is irradiated with high illuminance light, a diode-connected protection transistor 6 is turned on. The protection transistor 6 is turned on, and excessive charges are discharged to a power source that supplies a power source voltage VDD to an output transistor 7.

SUMMARY

There has been a desire for noise reduction in the field of image sensors. For example, in a case of a stacked image sensor, an obtained image may be degraded due to leakage current (which may hereinafter be referred to as "dark current") from a charge storage region or to the charge storage region. It is advantageous to reduce such leakage current.

One non-limiting and exemplary embodiment provides the following.

In one general aspect, the techniques disclosed here feature an imaging device including: a semiconductor layer; and a pixel cell including an impurity region of a first conductivity type, the impurity region being located in the semiconductor layer, a photoelectric converter electrically connected to the impurity region, the photoelectric converter being located above the semiconductor layer, a first transistor having a first gate, a first source and a first drain, one of the first source and the first drain being electrically connected to the impurity region, a second transistor having a second gate of a second conductivity type different from the first conductivity type, a second source and a second drain, the second transistor including the impurity region as one of the second source and the second drain, the second gate being electrically connected to the impurity region, and a third transistor having a third gate, a third source and a third drain, the third gate being electrically connected to the photoelectric converter.

It should be noted that general or specific embodiments may be implemented as an element, a device, a module, a system, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Knowledge of the Inventors)

Figure 1:
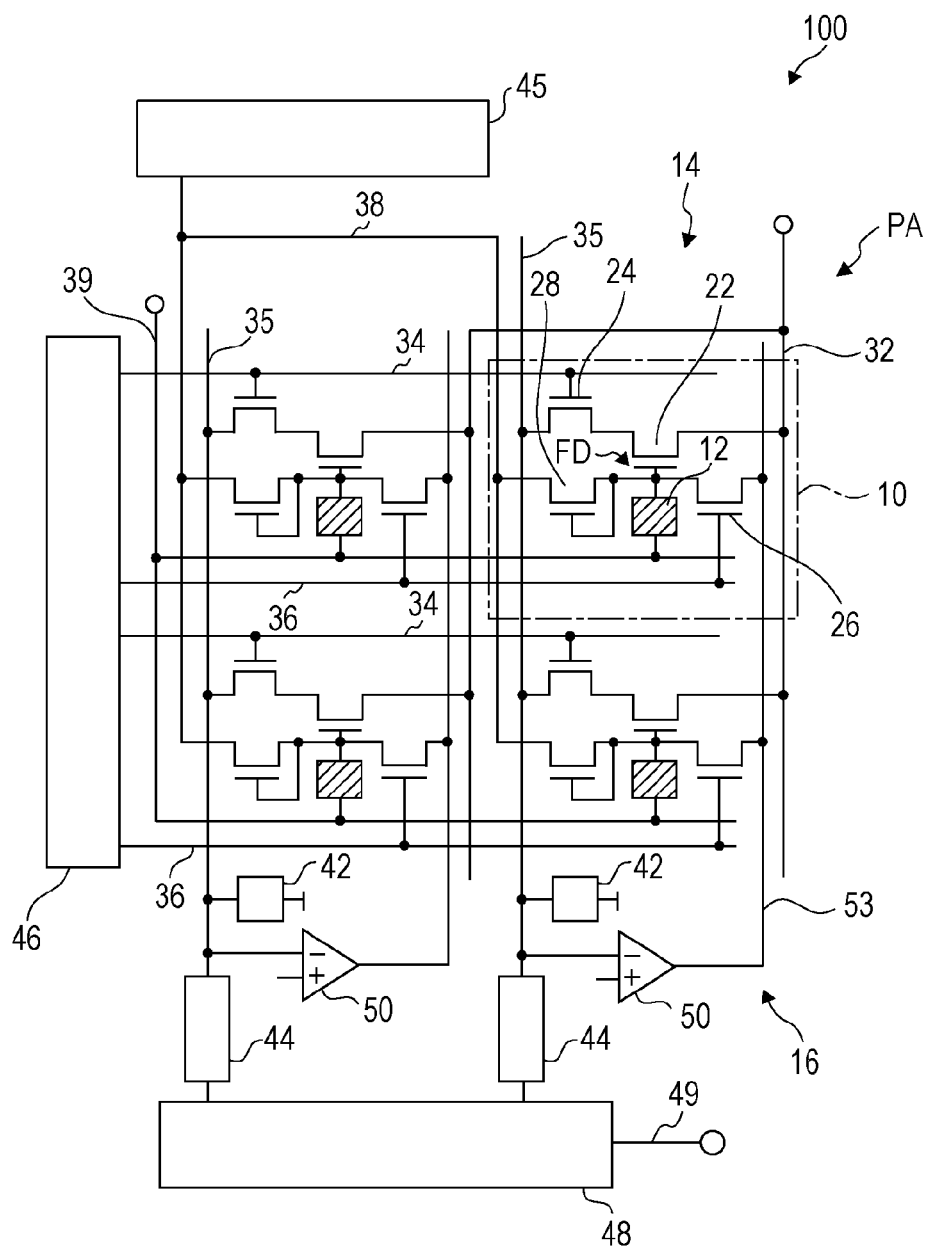
FIG. 1 is a diagram that illustrates an exemplary circuit configuration of an imaging device according to an embodiment of the present disclosure.

In general, a stacked image sensor has a connection portion that electrically connects a read-out circuit formed in a semiconductor substrate and a photoelectric conversion unit. Various p-n junctions are formed around a connection point between the semiconductor substrate and the connection portion. The connection portion that electrically connects the semiconductor substrate and the photoelectric conversion unit, and an impurity region in the semiconductor substrate in the vicinity of the connection point function as a charge storage region that stores signal charges generated by the photoelectric conversion unit.

A depletion layer is formed in the vicinity of the p-n junction. Recombination of charges in the depletion layer in the vicinity of the p-n junction may become a cause of occurrence of leakage current. The inventors focused on a fact that such a depletion layer might be formed under a gate electrode of a transistor in an off state. The impurity region in the semiconductor substrate, in which the signal charges are stored, is connected with a drain (or a source) of a reset transistor that resets an electric potential of the charge storage region, for example. Further, as it is understood from FIG. 1 of Japanese Unexamined Patent Application Publication No. 2012-209342, the drain (or the source) of a protection transistor may also be connected with the impurity region in which the signal charges are stored. Accordingly, it is possible that performance of the imaging device is degraded by dark current due to the depletion layers that are formed under the gate electrodes of those transistors.

The inventors conducted intensive studies in order to restrain formation of the depletion layer under the gate electrode of the transistor and found that an N channel transistor, for example, was set to a storage mode by applying a negative voltage to the gate electrode and the depletion layer under the gate electrode might thereby be diminished. However, as it is understood also from FIG. 1 of Japanese Unexamined Patent Application Publication No. 2012-209342, the protection transistor is used in a manner such that the drain (or the source) is connected with a gate (diode connection). Thus, a desired voltage may not be applied to the gate from the outside. The inventors conducted further studies and found that the gate electrode of a different conductivity type from the conductivity type of the drain (or the source) was used and the depletion layer under the gate electrode of a diode-connected transistor might thereby be diminished.

An outline of aspects of the present disclosure is as follows.

[Item 1]

An imaging device comprising:
a semiconductor layer; and
a pixel cell including
an impurity region of a first conductivity type, the impurity region being located in the semiconductor layer,
a photoelectric converter electrically connected to the impurity region, the photoelectric converter being located above the semiconductor layer,
a first transistor having a first gate, a first source and a first drain, one of the first source and the first drain being electrically connected to the impurity region,
a second transistor having a second gate of a second conductivity type different from the first conductivity type, a second source and a second drain, the second transistor including the impurity region as one of the second source and the second drain, the second gate being electrically connected to the impurity region, and
a third transistor having a third gate, a third source and a third drain, the third gate being electrically connected to the photoelectric converter.

[Item 2]

The imaging device according to item 1, wherein the first transistor includes the impurity region as the one of the first source and the first drain.

[Item 3]

The imaging device according to item 1 or 2, further including:
a first voltage supply circuit that supplies a first voltage,
a second voltage supply circuit that supplies a second voltage,
a first line through which the first voltage supply circuit supplies the first voltage to one of the third source and the third drain; and
a second line through which the second voltage supply circuit supplies a second voltage to the other of the second source and the second drain, wherein
the second voltage is different from the first voltage, and is on a same side as a reset voltage with respect to the first voltage, the reset voltage being a voltage for initializing a charge generated by the photoelectric converter.

[Item 4]

The imaging device according to any one of items 1 to 3, wherein
the first transistor has a first gate insulating layer between the first gate and the semiconductor layer,
the second transistor has a second gate insulating layer between the second gate and the semiconductor layer, and
a thickness of the first gate insulating layer is equivalent to a thickness of the second gate insulating layer.

[Item 5]

The imaging device according to any one of items 1 to 4, wherein
the pixel cell further includes a connector that electrically connects the second gate to the impurity region,
the impurity region includes a first region and a second region, a part of the second region being located on a surface of the semiconductor layer, the first region covering an underneath of the second region,
an impurity concentration of the second region is higher than an impurity concentration of the first region, and
the connector is in contact with the second region.

[Item 6]

The imaging device according to item 5, wherein the connector has a first plug, a second plug and a metal wiring layer, one end of the first plug being connected to the impurity region, one end of the second plug being connected to the second gate, the metal wiring layer electrically connecting the first plug to the second plug.

[Item 7]

The imaging device according to any one of items 1 to 6, wherein the first gate is of the first conductivity type.

[Item 8]

The imaging device according to any one of items 1 to 7, i wherein the semiconductor layer is of the second conductivity type.

[Item 9]

The imaging device according to item 1 or 2, including:
the semiconductor layer; and
the pixel cell which includes
an impurity region that is locator in the semiconductor layer, the photoelectric converter that is located above the semiconductor layer and is electrically connected with the impurity region, the first transistor which has the first source, the first drain, and the first gate electrode and in which one of the first source and the first drain is electrically connected with the impurity region, the second transistor which has the second source, the second drain, and the second gate electrode and includes the impurity region as one of the second source and the second drain and in which the second gate electrode is electrically connected with the impurity region, and the third transistor which has the third source, the third drain, and the third gate electrode and in which the third gate electrode is electrically connected with the photoelectric converter, the first voltage line that supplies the first voltage to one of the third source and the third drain of the third transistor; and the second voltage line that supplies the second voltage to the other of the second source and the second drain of the second transistor, in which the second voltage is a voltage on the same side as the reset voltage that initializes the charge of the photoelectric converter with respect to the first voltage.

[Item 10]

An imaging device that has plural pixel cells, in which each of the plural pixel cells includes a semiconductor substrate that has an impurity region of a first conductivity type, a photoelectric converter that is electrically connected with the impurity region, a first transistor which has a first gate electrode of the first conductivity type and in which one of a source and a drain is electrically connected with the impurity region, a second transistor which has a second gate electrode of a second conductivity type and includes the impurity region as one of a source and a drain, a third transistor that has a third gate electrode which is electrically connected with the photoelectric converter, and a connector that electrically connects the second gate electrode and the impurity region together.

In a configuration of item 10, substantially the same state as a case where a negative voltage is applied to the gate electrode of the second transistor may be realized.

[Item 11]

The imaging device according to item 10, in which the first transistor includes the impurity region as one of the source and the drain.

[Item 12]

The imaging device according to item 10 or 11, further including:

a first voltage line that supplies a first voltage to one of the source and the drain of the third transistor; and a second voltage line that supplies a second voltage which is lower than the first voltage to the other of the source and the drain of the second transistor.

In a configuration of item 12, the second transistor may be caused to operate more stably.

[Item 13]

The imaging device according to any one of items 10 to 12, in which a thickness of a gate insulating layer of the first transistor is equivalent to a thickness of a gate insulating layer of the second transistor.

In a configuration of item 13, complication of a manufacturing process may be avoided.

[Item 14]

The imaging device according to any one of items 10 to 13, in which the impurity region includes a first region and a second region that is formed in the first region, an impurity concentration of the second region is higher than an impurity concentration of the first region, and the connector is connected with the second region of the impurity region.

In a configuration of item 14, a contact resistance may be reduced.

[Item 15]

The imaging device according to any one of items 10 to 14, in which the connector has a first plug whose one end is connected with the impurity region, a second plug whose one end is connected with the second gate electrode, and a metal wiring layer that electrically connects the first plug and the second plug together.

In a configuration of item 15, direct junction between members of mutually different conductivity types may be avoided.

[Item 16]

The imaging device according to item 3, in which an absolute value of a difference between the reset voltage and the second voltage is less than an absolute value of a difference between the reset voltage and the first voltage.

[Item 17]

The imaging device according to item 16, in which the second voltage is a voltage between the reset voltage and the first voltage.

The embodiments of the present disclosure will hereinafter be described in detail with reference to drawings. It should be noted that all the embodiments described below illustrate general or specific examples. Values, shapes, materials, elements, arrangement or connection manners of elements, steps, orders of steps, and so forth that are described in the following embodiments are merely illustrative and are not intended to limit the present disclosure. Various aspects described herein may be combined with each other unless the combination is contradictory. Further, the elements that are not described in the independent claim, which provides the most superordinate concepts, among the elements in the following embodiments will be described as arbitrary elements. In descriptions made below, elements having substantially equivalent functions will be denoted by common reference characters, and descriptions thereof may not be made.

(Embodiment of Imaging Device)

FIG. 1 illustrates an exemplary circuit configuration of an imaging device according to an embodiment of the present disclosure. An imaging device 100 illustrated in FIG. 1 has a pixel array PA that includes plural unit pixel cells 10 and peripheral circuits that include a load circuit 42, a column signal processing circuit 44, a vertical scanning circuit 46, a horizontal signal read-out circuit 48, and the like. In the configuration exemplified in FIG. 1, the pixel array PA includes the plural unit pixel cells 10 that are arranged in a matrix manner. The plural unit pixel cells 10 are one-dimensionally or two-dimensionally disposed and thereby form an imaging region (photosensitive region). FIG. 1 illustrates four unit pixel cells 10 that are disposed in two rows and two columns among the plural unit pixel cells 10 that are arranged in a matrix manner in order to avoid complexity of the drawing. It goes without saying that the number and arrangement of the unit pixel cells 10 in the pixel array PA are not limited to this example. For example, the unit pixel cells 10 may be disposed one-dimensionally. In this case, the imaging device 100 may be used as a line sensor.

As described in detail later, each of the unit pixel cells 10 generally includes a photoelectric conversion unit 12 and a signal detection circuit 14 that detects a signal generated by the photoelectric conversion unit 12. The signal detection circuit 14 is formed on the semiconductor substrate, and the photoelectric conversion unit 12 is arranged above the semiconductor substrate. That is, here, a stacked image sensor will be exemplified as the imaging device 100. Note that the terms "above" and "below" are used herein to indicate relative arrangement of members and are not intended to limit the position of the imaging device 100 in use. The semiconductor substrate is not limited to a substrate whose whole body is a semiconductor layer but may be an insulating substrate or the like in which a semiconductor layer is provided on the surface on the side where the imaging region is formed.

The photoelectric conversion unit 12 of the unit pixel cell 10 receives incidence of light and thereby produces positive and negative charges (typically, a positive hole and an electron pair). As illustrated in FIG. 1, the photoelectric conversion unit 12 of each of the unit pixel cells 10 has connection with a storage control line 39. A prescribed voltage is applied to the storage control line 39 when the imaging device 100 operates. For example, in a case where the positive charge between the positive and negative charges that are generated by the photoelectric conversion is used as a signal charge, a positive voltage of approximately 10 V, for example, is applied to the storage control line 39 when the imaging device 100 operates. A prescribed positive voltage is applied to the storage control line 39, and the positive charge (the positive hole, for example) between the positive and negative charges generated by the photoelectric conversion may thereby be selectively stored in the charge storage region. A case will be exemplified below where the positive charge between the positive and negative charges generated by the photoelectric conversion is used as the signal charge.

In the configuration exemplified in FIG. 1, the signal detection circuit 14 of each of the unit pixel cells 10 includes an amplifier transistor (also referred to as read-out transistor) 22 and an address transistor (also referred to as row-select transistor) 24. In this example, the signal detection circuit 14 further includes a reset transistor 26 and a protection transistor 28. The amplifier transistor 22, the address transistor 24, the reset transistor 26, and the protection transistor 28 are typically field effect transistors (FET) that are formed on the semiconductor substrate. An example will be described below where an N-channel MOS is used as the transistor, unless specifically stated otherwise.

The gate of the amplifier transistor 22 is electrically connected with the photoelectric conversion unit 12. As described later, the charge that is generated by the photoelectric conversion unit 12 is stored in the charge storage region, a portion of which includes a charge storage node (also referred to as "floating diffusion node") FD between the photoelectric conversion unit 12 and the amplifier transistor 22. The drain of the amplifier transistor 22 is connected with power source wiring (source follower power source) 32 that supplies a prescribed power source voltage VDD (approximately 3.3 V, for example) to the each of the unit pixel cells 10 when the imaging device 100 operates. The source of the amplifier transistor 22 is connected with the drain of the address transistor 24. The amplifier transistor 22 outputs the signal voltage in accordance with the amount of the signal charge generated by the photoelectric conversion unit 12.

In this example, the protection transistor 28 is connected with the charge storage node FD. The drain (or the source) of the protection transistor 28 is connected with the charge storage node FD. The source (or the drain) of the protection transistor 28 is connected with a charge recovery line 38. As illustrated in FIG. 1, the gate and the drain (or the source) of the protection transistor 28 are electrically connected with each other. That is, those are at the same electric potential. In a case where the photoelectric conversion unit 12 is irradiated with high illuminance light and the charge amount stored in the charge storage node FD thereby exceeds a prescribed magnitude, that is, the electric potential of the charge storage node FD exceeds a prescribed electric potential, the protection transistor 28 is turned on, and excessive charges are discharged from the charge storage node FD to the charge recovery line 38.

In the configuration exemplified in FIG. 1, the charge recovery line 38 is connected with a voltage supply circuit 45. The voltage supply circuit 45 applies a prescribed voltage to the source (or the drain) of the protection transistor 28 via the charge recovery line 38 when the imaging device 100 operates. Typically, the voltage applied to the charge recovery line 38 is lower than the voltage applied to the power source wiring 32 (here, the power source voltage VDD). As described in detail later, the lower voltage than the voltage applied to the power source wiring 32 is supplied to the charge recovery line 38, and the protection transistor 28 may thereby be caused to operate more stably.

The voltage supply circuit 45 is not limited to a specific power source circuit but may be a circuit that generates a prescribed voltage or may be a circuit that converts a voltage supplied from another power source to a prescribed voltage. The voltage supply circuit 45 may be different from a circuit that supplies a prescribed voltage to the power source wiring 32, or those circuits may be portions of one voltage supply circuit. At least one of the voltage supply circuit 45 and the circuit that supplies the prescribed voltage to the power source wiring 32 may be a portion of the vertical scanning circuit 46, which will be described later. The imaging device 100 may include a controller that controls, for example, the voltage supply circuit 45 and the circuit that supplies the prescribed voltage to the power source wiring 32.

The source of the address transistor 24 is connected with a vertical signal line 35. As illustrated in FIG. 1, the vertical signal line 35 is provided for each column of the plural unit pixel cells 10, and the load circuit 42 and the column signal processing circuit (also referred to as "row signal storage circuit") 44 are connected with each of the vertical signal lines 35. The load circuit 42 together with the amplifier transistor 22 forms a source follower circuit. The amplifier transistor 22 receives the supply of the power source voltage VDD by the drain and thereby amplifies the voltage that is applied to the gate. In other words, the amplifier transistor 22 amplifies the signal generated by the photoelectric conversion unit 12.

The gate of the address transistor 24 is connected with an address signal line 34. The address signal line 34 is provided for each row of the plural unit pixel cells 10. The address signal line 34 is connected with the vertical scanning circuit (also referred to as "row scanning circuit") 46, and the vertical scanning circuit 46 applies a row-select signal for controlling turning on and off of the address transistor 24 to the address signal line 34. Accordingly, the row as a target of reading out is scanned in the vertical direction (column direction), and the row as the target of the reading out is selected. The vertical scanning circuit 46 controls turning on and off of the address transistor 24 via the address signal line 34 and may thereby read out an output of the amplifier transistor 22 of the selected unit pixel cell 10 to the corresponding vertical signal line 35. The arrangement of the address transistor 24 is not limited to the example illustrated in FIG. 1 but may be between the drain of the amplifier transistor 22 and the power source wiring 32.

The signal voltage that is output to the vertical signal line 35 via the address transistor 24 and is from the unit pixel cell 10 is input to the corresponding column signal processing circuit 44 among plural column signal processing circuits 44 that are provided for the respective columns of the plural unit pixel cells 10 in accordance with the vertical signal lines 35. The column signal processing circuit 44 performs noise suppression signal processing, which is represented by correlated double sampling, analog-digital conversion (AD conversion), and so forth. The column signal processing circuit 44 is connected with the horizontal signal read-out circuit (also referred to as "column scanning circuit") 48, and the horizontal signal read-out circuit 48 sequentially reads out signals from the plural column signal processing circuits 44 to a horizontal common signal line 49.

In the configuration exemplified in FIG. 1, the signal detection circuit 14 includes the reset transistor 26 whose drain is connected with the charge storage node FD. The gate of the reset transistor 26 is connected with a reset signal line 36 that has connection with the vertical scanning circuit 46. The reset signal line 36 is provided for each of the rows of the plural unit pixel cells 10, similarly to the address signal line 34. The vertical scanning circuit 46 applies the row-select signal to the address signal line 34 and may thereby select the unit pixel cells 10 as targets of resetting by the row as a unit. In addition, the vertical scanning circuit 46 applies a reset signal for controlling turning on and off of the reset transistor 26 to the gate of the reset transistor 26 via the reset signal line 36. Accordingly, the reset transistors 26 in the selected row are turned on. The reset transistor 26 is turned on, and the electric potential of the charge storage node FD is thereby reset.

In this example, the source of the reset transistor 26 is connected with one of feedback lines 53 that are provided for respective columns of the plural unit pixel cells 10. That is, in this example, as the reset voltage that initializes the charge of the photoelectric conversion unit 12, the voltage of the feedback line 53 is supplied to the charge storage node FD. Here, the above-described feedback line 53 is connected with an output terminal in one corresponding inverting amplifier 50 among the inverting amplifiers 50 that are provided for respective columns of the plural unit pixel cells 10. As described above, the peripheral circuits of the imaging device 100 exemplified in FIG. 1 include plural inverting amplifiers 50.

One of the columns of the plural unit pixel cells 10 will be focused. As illustrated in FIG. 1, an inverting input terminal of the inverting amplifier 50 is connected with the vertical signal line 35 of the column. Further, an output terminal of the inverting amplifier 50 is connected with the reset transistor 26 of one or more unit pixel cells 10 that belong to the column via the feedback line 53. Accordingly, when the address transistor 24 and the reset transistor 26 in a certain unit pixel cell 10 are turned on, the inverting input terminal of the inverting amplifier 50 receives an output of the address transistor 24 of the unit pixel cell 10.

A prescribed voltage (for example, a positive voltage of 1 V or around 1 V) Vref is supplied to a non-inverting input terminal of the inverting amplifier 50 when the imaging device 100 operates. One of the one or more unit pixel cells 10 that belong to the column is selected, the address transistor 24 and the reset transistor 26 are turned on, and a feedback path that causes an output of the unit pixel cell 10 to be negatively fed back may thereby be formed. Formation of the feedback path causes the voltage of the vertical signal line 35 to converge on an input voltage Vref to the non-inverting input terminal of the inverting amplifier 50. In other words, the formation of the feedback path causes the voltage of the charge storage node FD to be reset to a voltage at which the voltage of the vertical signal line 35 becomes Vref. As the voltage Vref, a voltage of an arbitrary magnitude in a range between the power source voltage (3.3 V, for example) and grounding (0 V) may be used. The inverting amplifier 50 may be referred to as feedback amplifier. As described above, the imaging device 100 exemplified in FIG. 1 includes a feedback circuit 16 in which the inverting amplifier 50 is included in a portion of the feedback path.

As widely known, thermal noise that is referred to as kTC noise occurs in accordance with tuning on or off of the transistor. Noise that occurs in accordance with turning on or off of the reset transistor is referred to as reset noise. After the electric potential of the charge storage region is reset, the reset noise that occurs due to turning off of the reset transistor remains in the charge storage region at a time before storage of the signal charge. However, the reset noise that occurs in accordance with turning off of the reset transistor may be reduced by using the feedback. Formation of the feedback path causes alternating current components of the thermal noise to be fed back to the source of the reset transistor 26. Details of restraint of the reset noise by using the feedback are described in International Publication No. 2012/147302. The disclosure of International Publication No. 2012/147302 will be incorporated by reference herein in its entirety. In the configuration exemplified in FIG. 1, because the feedback path is formed immediately before the reset transistor 26 is turned off, it is possible to reduce the reset noise that occurs in accordance with turning off of the reset transistor 26.

(Device Structure of Unit Pixel Cell 10)

Figure 2:
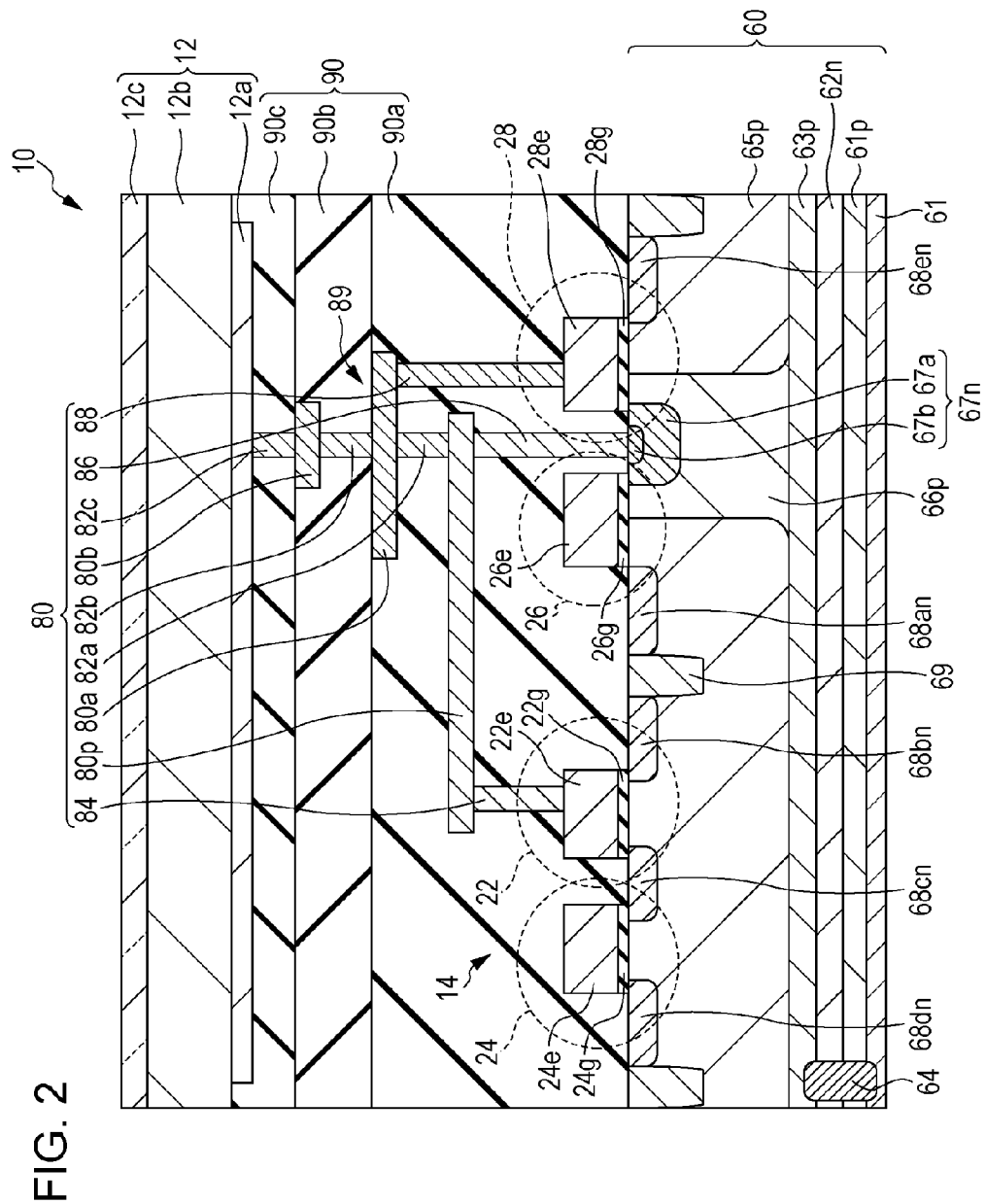
FIG. 2 is a schematic cross-sectional view that illustrates a typical example of a device structure of a unit pixel cell.

FIG. 2 illustrates a typical example of a device structure of the unit pixel cell 10. As schematically illustrated in FIG. 2, the unit pixel cell 10 generally has a semiconductor substrate 60, the photoelectric conversion unit 12 that is arranged above the semiconductor substrate 60, a wiring structure 80 that is arranged between the photoelectric conversion unit 12 and the semiconductor substrate 60.

In the semiconductor substrate 60, the amplifier transistor 22, the address transistor 24, the reset transistor 26, and the protection transistor 28 in the above-described signal detection circuit 14 are formed. In FIG. 2, for convenience of description, the amplifier transistor 22, the address transistor 24, the reset transistor 26, and the protection transistor 28 are illustrated in one cross-sectional view. As described later, the semiconductor substrate 60 includes an n-type impurity region 67n that functions as a portion of the charge storage region.

An interlayer insulating layer 90 that covers those transistors is arranged on the semiconductor substrate 60. The above-described wiring structure 80 is arranged in the interlayer insulating layer 90. In this example, the interlayer insulating layer 90 has a laminated structure that includes three insulating layers 90a, 90b, and 90c, and the wiring structure 80 in the interlayer insulating layer 90 includes wiring layers 80a, 80b, and 80p, plugs 82a, 82b, and 82c, and contact plugs 84, 86, and 88. The number of the insulating layers in the interlayer insulating layer 90 and the number of the wiring layers in the wiring structure 80 are not limited to this example but may arbitrarily be set.

The wiring structure 80 electrically connects the photoelectric conversion unit 12 with the n-type impurity region 67n of the semiconductor substrate 60. The wiring layers 80a and 80b, the plugs 82a to 82c, and the contact plug 88 in the wiring structure 80 are typically formed of metal such as copper or tungsten (or a metal compound such as metal nitride or metal oxide). Meanwhile, here, the wiring layer 80p and the contact plugs 84 and 86 are respectively a polysilicon layer and polysilicon plugs of a conductivity type of an n-type.

The semiconductor substrate 60 includes a support substrate 61 and one or more semiconductor layers that are formed on the support substrate 61. Here, as the support substrate 61, a p-type silicon (Si) substrate will be exemplified. In the configuration exemplified in FIG. 2, the semiconductor substrate 60 has a p-type semiconductor layer 61p on the support substrate 61, an n-type semiconductor layer 62n on the p-type semiconductor layer 61p, a p-type semiconductor layer 63p on the n-type semiconductor layer 62n, and a p-type semiconductor layer 65p on the p-type semiconductor layer 63p. The p-type semiconductor layer 63p is formed throughout the whole surface of the support substrate 61. The p-type semiconductor layer 65p has a p-type impurity region 66p with a lower impurity concentration, n-type impurity regions 68an, 68bn, 68cn, 68dn, and 68en, and an element isolation region 69.

Each of the p-type semiconductor layer 61p, the n-type semiconductor layer 62n, the p-type semiconductor layer 63p, and the p-type semiconductor layer 65p is typically formed by epitaxial growth. The impurity concentrations of the p-type semiconductor layer 63p and the p-type semiconductor layer 65p are similar to each other and are higher than the impurity concentration of the p-type semiconductor layer 61p. The n-type semiconductor layer 62n that is arranged between the p-type semiconductor layer 61p and the p-type semiconductor layer 63p restrains inflows of minority carriers from the support substrate 61 (which may be considered as the p-type semiconductor layer 61p) or the peripheral circuits to the charge storage region that stores the signal charges. When the imaging device 100 operates, the electric potential of the n-type semiconductor layer 62n is controlled via a well contact (not illustrated) that is provided on the outside of the pixel array PA. Further, in this example, the semiconductor substrate 60 has a p-type region 64 that is provided between the p-type semiconductor layer 63p and the support substrate 61 so as to pass through the p-type semiconductor layer 61p and the n-type semiconductor layer 62n. The p-type region 64 has a high impurity concentration compared to the p-type semiconductor layer 63p and the p-type semiconductor layer 65p and electrically connects the p-type semiconductor layer 63p with the support substrate 61. When the imaging device 100 operates, the electric potentials of the p-type semiconductor layer 63p and the support substrate 61 are controlled via a substrate contact (not illustrated) that is provided on the outside of the pixel array PA.

The above-described n-type impurity region 67n is arranged in the p-type impurity region 66p that is formed in the p-type semiconductor layer 65p as a p-well. As schematically illustrated in FIG. 2, the n-type impurity region 67n is formed in the vicinity of a surface of the semiconductor substrate 60, and at least a portion of the n-type impurity region 67n is positioned on the surface of the semiconductor substrate 60. In the configuration exemplified in FIG. 2, the n-type impurity region 67n includes a first region 67a and a second region 67b. A portion of the second region 67b is positioned on a surface of the p-type semiconductor layer 65p. The first region 67a covers a lower portion of the second region 67b. The second region 67b in the n-type impurity region 67n is formed in the first region 67a and has a higher impurity concentration than the first region 67a.

In the configuration exemplified in FIG. 2, a contact plug 86 is connected with the second region 67b that is formed in the semiconductor substrate 60. Although the second region 67b in the n-type impurity region 67n does not necessarily have to be formed, the impurity concentration of the second region 67b as a connection part between the contact plug 86 and the semiconductor substrate 60 is made comparatively high, and an effect of restraining spread of the depletion layer (depleting) around the portion in which the contact plug 86 contacts with the semiconductor substrate 60 may thereby be obtained. The spread of the depletion layer around the portion in which the contact plug 86 contacts with the semiconductor substrate 60 is restrained, and the leakage current due to crystal defects of the semiconductor substrate 60 at the interface between the contact plug 86 and the semiconductor substrate 60 (which may be considered as an interface state) may thereby be restrained. Further, the contact plug 86 is connected with the second region 67b that has a comparatively high impurity concentration, and an effect of reducing a contact resistance may thereby be obtained.

The junction capacitance that is formed by the p-n junction between the p-type impurity region 66p and the n-type impurity region 67n functions as a capacitance that stores at least a portion of the signal charges. This capacitance configures a portion of the charge storage region. In the configuration exemplified in FIG. 2, the first region 67a with a lower impurity concentration than the second region 67b is arranged between the second region 67b of the n-type impurity region 67n and the p-type impurity region 66p. Further, the first region 67a is positioned also between the second region 67b of the n-type impurity region 67n and the p-type semiconductor layer 65p. The first region 67a with a relatively low impurity concentration is arranged around the second region 67b, and the field intensity that is formed by the p-n junction between the n-type impurity region 67n and the p-type semiconductor layer 65p (or the p-type impurity region 66p) may thereby be attenuated. The field intensity formed by the p-n junction is attenuated, and the leakage current due to the field formed by the p-n junction is thereby restrained.

The p-type semiconductor layer 65p is arranged so as to contact with the p-type semiconductor layer 63p, and it is thereby possible to control the electric potential of the p-type semiconductor layer 65p via the p-type semiconductor layer 63p when the imaging device 100 operates. Employment of such a structure enables a region with a relatively low impurity concentration (here, the p-type impurity region 66p and the first region 67a of the n-type impurity region 67n) to be arranged around the portion in which the contact plug 86 contacts with the semiconductor substrate 60 (here, the second region 67b of the n-type impurity region 67n).

The n-type impurity region 67n that is formed in the p-type impurity region 66p functions as the drain of the reset transistor 26. In this example, the reset transistor 26 includes at least a portion of the n-type impurity region 67n as the drain and further includes a gate insulating layer 26g on the semiconductor substrate 60, a gate electrode 26e on the gate insulating layer 26g, and the n-type impurity region 68an.

As schematically illustrated in FIG. 2, when seen in the normal direction of the semiconductor substrate 60, a laminated structure of the gate insulating layer 26g and the gate electrode 26e overlaps with at least a portion of the n-type impurity region 67n. The gate electrode 26e of the reset transistor 26 is typically a polysilicon electrode of the conductivity type of the n-type.

In the configuration exemplified in FIG. 2, the n-type impurity region 67n as the drain is electrically connected with the photoelectric conversion unit 12 via the contact plug 86, the wiring layer 80p, the plug 82a, the wiring layer 80a, the plug 82b, the wiring layer 80b, and the plug 82c. Meanwhile, the n-type impurity region 68an is connected with the above-described feedback line 53 via a contact plug which is not illustrated and functions as the source of the reset transistor 26. The reset transistor 26 is turned on, and a reset voltage (here, the voltage of the feedback line 53) for initializing the photoelectric conversion unit 12 is thereby supplied to the photoelectric conversion unit 12 via the n-type impurity region 68an. Here, a gate electrode 22e of the amplifier transistor 22 is connected with the n-type impurity region 67n via the contact plug 86, the wiring layer 80p, and the contact plug 84. Thus, the reset transistor 26 is turned on, the charges stored in the charge storage region are thereby reset, and the electric potential of the gate electrode 22e of the amplifier transistor 22 is thereby reset to the reset voltage.

In this example, the n-type impurity region 67n is shared by the protection transistor 28 also and has a function as the drain (or the source) of the protection transistor 28. The protection transistor 28 includes at least a portion of the n-type impurity region 67n and further includes a gate insulating layer 28g on the semiconductor substrate 60, a gate electrode 28e on the gate insulating layer 28g, and the n-type impurity region 68en. When seen in the normal direction of the semiconductor substrate 60, a laminated structure of the gate insulating layer 28g and the gate electrode 28e overlaps with at least a portion of the n-type impurity region 67n. The n-type impurity region 68en is connected with the above-described charge recovery line 38 via a contact plug which is not illustrated. The n-type impurity regions 68en functions as the source (or the drain) of the protection transistor 28. When the imaging device 100 operates, a prescribed voltage (typically, a lower voltage than the power source voltage VDD) is applied to the n-type impurity region 68en via the charge recovery line 38.

The gate electrode 28e of the protection transistor 28 is electrically connected with the n-type impurity region 67n as the drain (or the source) of the protection transistor 28 via a connection portion 89. Here, the connection portion 89 includes a contact plug 88 whose one end is connected with the gate electrode 28e of the protection transistor 28, the wiring layer 80a, the plug 82a, the wiring layer 80p, and the contact plug 86. That is, here, the connection portion 89 includes a portion of the wiring structure 80, and the gate electrode 28e of the protection transistor 28 thus has electrical connection with the photoelectric conversion unit 12. In a case where the photoelectric conversion unit 12 is irradiated with high illuminance light and the voltage of the charge storage region rises while exceeding a threshold voltage of the protection transistor 28, the protection transistor 28 is turned on. The protection transistor 28 is turned on, and excessive charges are discharged from the n-type impurity region 67n to the n-type impurity region 68en.

In the embodiment of the present disclosure, the gate electrode 28e of the protection transistor 28 is formed as a polysilicon electrode of a different conductivity type from the n-type impurity region 67n. That is, here, the gate electrode 28e is a polysilicon electrode of a conductivity type of a p-type, and the conductivity type of the gate electrode 28e of the protection transistor 28 is different from the conductivity type of the gate electrode 26e of the reset transistor 26. As described in detail later, an electrode of a different conductivity type from the conductivity type of the drain (or the source) is used as the gate electrode 28e of the protection transistor 28, and the protection transistor 28 that is turned off may thereby be caused to become a storage mode. In other words, substantially the same state as a case where a negative voltage is applied to the gate electrode 28e of the protection transistor 28 may be realized. As described later, the protection transistor 28 is caused to become the storage mode, and the dark current of the protection transistor 28 that is turned off may thereby be reduced.

In a common imaging device, the conductivity types of the sources and the drains of the transistors in the pixel cell and the conductivity type of the polysilicon electrodes, which are the gate electrodes of those transistors, are usually the same. Further, it is general that the conductivity type of the gate electrode is common to the plural transistors in the pixel cell in order to avoid complication of a manufacturing process. In the embodiment of the present disclosure, the conductivity type of the gate electrode in a portion of the transistors (here, the protection transistor 28) in the pixel cell is intentionally made different from the conductivity type of the gate electrodes of the other transistors, and an effect of reducing the dark current may thereby be obtained.

In this example, the contact plug 86 connected with the n-type impurity region 67n is electrically connected with the contact plug 88 connected with the gate electrode 28e of the protection transistor 28 via the wiring layer 80a that is formed as a metal wiring layer. Further, in this example, the contact plug 88 is formed of metal. As described above, the connection via metal (or a metal compound) enables the electrical junction between two members of mutually different conductivity types while direct contact between the two members is avoided. For example, in a case where the contact plug 88 is a polysilicon plug of the conductivity type of the n-type, the junction between the contact plug 88 and the gate electrode 28e becomes non-ohmic junction. As the configuration exemplified here, the connection via metal or a metal compound enables ohmic connection between the contact plug 88 and the gate electrode 28e. Alternatively, the contact plug 88 may be formed of a polysilicon of the same conductivity type (here, the p-type) as the gate electrode 28e. In this case, the junction between the contact plug 88 and the wiring layer 80a may be made ohmic junction.

In the configuration exemplified in FIG. 2, the amplifier transistor 22 includes a gate insulating layer 22g on the semiconductor substrate 60, the gate electrode 22e on the gate insulating layer 22g, and the n-type impurity regions 68bn and 68cn that are formed on the semiconductor substrate 60. Here, similarly to the gate electrode 26e of the reset transistor 26, the gate electrode 22e is a polysilicon electrode of the conductivity type of the n-type. In the configuration exemplified in FIG. 2, the gate electrode 22e is electrically connected with the photoelectric conversion unit 12 via the contact plug 84, the wiring layer 80p, the plug 82a, the wiring layer 80a, the plug 82b, the wiring layer 80b, and the plug 82c. The n-type impurity region 68bn has connection with the power source wiring 32 (not illustrated in FIG. 2) and functions as the drain of the amplifier transistor 22. Meanwhile, the n-type impurity region 68cn functions as the source of the amplifier transistor 22.

The element isolation region 69 is provided between the n-type impurity region 68bn as the drain of the amplifier transistor 22 and the n-type impurity region 68an as the source of the reset transistor 26. The element isolation region 69 is provided around the pair of the amplifier transistor 22 and the address transistor 24 and around the pair of reset transistor 26 and the protection transistor 28. The element isolation region 69 electrically isolates the signal detection circuit 14 of a certain unit pixel cell 10 from the signal detection circuit 14 of another unit pixel cell 10. The element isolation region 69 is a p-type impurity diffusion region, for example.

Although not illustrated in FIG. 2, a contact plug that electrically connects the n-type impurity region 68bn and the power source wiring 32 together is typically arranged between those. The power source wiring 32 typically extends in the column direction. The power source wiring 32 is formed so as to extend along the column direction, and a voltage drop in the power source wiring 32 may thereby be reduced compared to a case where the power source wiring 32 is formed so as to extend along the row direction. This is because, in the case where the power supply line 32 is formed in such a manner as to extend in the row direction, since the unit pixel cells 10 are selected in a unit of rows at the time of reading out signals, an amount of current large enough to drive all of the unit pixel cells 10 in a single row has to be supplied to a single branch of the power supply line 32. If the power supply line 32 is formed in such a manner as to extend in the column direction, the amount of current to be supplied to a certain branch of the power supply line 32 is small enough to drive a single unit pixel cell 10 in a certain row that is selected from among the plurality of rows. Note that herein the row direction means the direction in which the row extends and the column direction means the direction in which the column extends. For example, in FIG. 1, the up-down direction of the page is the column direction, and the left-right direction of the page is the row direction.

The address transistor 24 includes a gate insulating layer 24g on the semiconductor substrate 60, a gate electrode 24e on the gate insulating layer 24g, and the n-type impurity regions 68cn and 68dn that are formed on the semiconductor substrate 60. In this example, the address transistor 24 shares the n-type impurity region 68cn with the amplifier transistor 22 and is thereby electrically connected with the amplifier transistor 22. The gate insulating layer 22g of the amplifier transistor 22, the gate insulating layer 24g of the address transistor 24, the gate insulating layer 26g of the reset transistor 26, and the gate insulating layer 28g of the protection transistor 28 are typically thermal oxide films (silicon dioxide films) of silicon in the same layer.

The n-type impurity regions 68cn functions as the drain of the address transistor 24. Meanwhile, the n-type impurity regions 68dn functions as the source of the address transistor 24. The n-type impurity region 68dn has connection with the vertical signal line 35 (not illustrated in FIG. 2). Although not illustrated in FIG. 2, a contact plug that electrically connects the n-type impurity region 68dn and the vertical signal line 35 together is typically arranged between those.

The photoelectric conversion unit 12 is arranged on the interlayer insulating layer 90 that covers the amplifier transistor 22, the address transistor 24, the reset transistor 26, and the protection transistor 28. The photoelectric conversion unit 12 includes a pixel electrode 12a that is formed on the interlayer insulating layer 90, a transparent electrode 12c that is opposed to the pixel electrode 12a, and a photoelectric conversion layer 12b that is arranged between the pixel electrode 12a and the transparent electrode 12c. The photoelectric conversion layer 12b of the photoelectric conversion unit 12 is formed of an organic material or an inorganic material such as amorphous silicon, receives light that is incident via the transparent electrode 12c, and thereby generates positive and negative charges by the photoelectric conversion. The photoelectric conversion layer 12b is typically formed over plural unit pixel cells 10. The photoelectric conversion layer 12b may include a layer configured with an organic material and a layer configured with an inorganic material.

The transparent electrode 12c is formed of an electrically conductive material which is transparent such as ITO and is arranged on the side of a light receiving surface of the photoelectric conversion layer 12b. The transparent electrode 12c is typically formed over plural unit pixel cells 10, similarly to the photoelectric conversion layer 12b. Although not illustrated in FIG. 2, the transparent electrode 12c has connection with the above-described storage control line 39, and a bias voltage of approximately 10 V, for example, is applied to the transparent electrode 12c via the storage control line 39 when the imaging device 100 operates. The electric potential of the transparent electrode 12c is made higher than the electric potential of the pixel electrode 12a by the bias voltage, and positive charges (the positive holes, for example) as the signal charges that are generated by the photoelectric conversion may thereby be collected by the pixel electrode 12a.

The pixel electrode 12a is an electrode that is formed of metal such as aluminum, copper, or titanium, a metal nitride, polysilicon which is doped with impurities and thereby made electrically conductive, or the like. The pixel electrode 12a is spatially isolated from the pixel electrodes 12a of the other adjacent unit pixel cells 10 and is thereby electrically isolated from the pixel electrodes 12a of the other unit pixel cells 10.

At least a portion of the above-described wiring structure 80 electrically connects the pixel electrode 12a with the signal detection circuit 14 that is formed on the semiconductor substrate 60. In this example, the pixel electrode 12a and the gate electrode 22e of the amplifier transistor 22 are electrically connected with each other via the plug 82c, the wiring layer 80b, the plug 82b, the wiring layer 80a, the plug 82a, the wiring layer 80p, and the contact plug 84. Accordingly, when the imaging device 100 operates, the signal voltage in accordance with the electric potential of the pixel electrode 12a is output from the amplifier transistor 22. Further, in this example, the pixel electrode 12a and the n-type impurity region 67n are electrically connected with each other via the plug 82c, the wiring layer 80b, the plug 82b, the wiring layer 80a, the plug 82a, the wiring layer 80p, and the contact plug 86. At least a portion of the charge storage region that stores the signal charges is configured with the wiring layers 80a, 80b, and 80p, the plugs 82a, 82b, and 82c, the contact plugs 84, 86, and 88, the gate electrode 22e of the amplifier transistor 22, the gate electrode 28e of the protection transistor 28, and the n-type impurity region 67n.

As described above, in the example illustrated in FIG. 2, the protection transistor 28 and the reset transistor 26 share the n-type impurity region 67n. The protection transistor 28 and the reset transistor 26 do not necessarily have to share the n-type impurity region 67n. For example, another n-type impurity region that is electrically connected with the n-type impurity region 67n may be formed in another spot of the semiconductor substrate 60, and the n-type impurity region may thereby be used as the drain (or the source) of the protection transistor 28 or the reset transistor 26. However, in view of miniaturization of the unit pixel cell 10 and restraint of the dark current, sharing the n-type impurity region 67n is more advantageous.

(Typical Examples of Function and Configuration of Protection Transistor)

In a case where the photoelectric conversion unit 12 is irradiated with very high illuminance light, the electric potential of the n-type impurity region 67n as the charge storage region may rise to the voltage that is applied to the transparent electrode 12c (approximately 10 V, for example). In a case where such an excessively high voltage is applied to the n-type impurity region 67n, the function of the n-type impurity region 67n may be impaired, or electrical breakdown may occur in the gate insulating layer 22g of the amplifier transistor 22. In a case where such damage occurs, the function of the pixel cell is impaired, and the imaging device breaks.

As illustrated in FIGS. 1 and 2, the protection transistor 28 that includes the n-type impurity region 67n as the drain (or the source) is provided in the unit pixel cell 10, and damage to the unit pixel cell 10 due to application of an excessively high voltage to the n-type impurity region 67n may thereby be restrained. For example, it is presumed that the photoelectric conversion unit 12 is irradiated with high illuminance light and the electric potential of the n-type impurity region 67n thereby rises while exceeding the threshold voltage of the protection transistor 28. As it is understood from FIG. 2, the gate electrode 28e of the protection transistor 28 is electrically connected with the n-type impurity region 67n by the connection portion 89. Thus, the protection transistor 28 turns on due to the rise of the electric potential of the n-type impurity region 67n. The protection transistor 28 is turned on, and excessive charges are discharged from the n-type impurity region 67n to the n-type impurity region 68en. Thus, damage to the unit pixel cell 10 is inhibited. The threshold voltage of the protection transistor 28 may appropriately be set as a lower voltage than the voltage at which loss of the function of the n-type impurity region 67n, electrical breakdown of the gate insulating layer 22g of the amplifier transistor 22, or the like occurs.

As described above, the protection transistor 28 is provided in the unit pixel cell 10, and it is thereby possible to inhibit damage to the unit pixel cell 10.

As described above, in the embodiment of the present disclosure, the gate electrode 28e of the protection transistor 28 is of a different conductivity type from the conductivity type of the drain (on the source) of the protection transistor 28. However, in a common transistor, the conductivity type of the polysilicon electrode as the gate electrode is the same as the conductivity types of the source and the drain. In order to turn off such a transistor, it is requested that the transistor is in the storage mode or that a portion under the gate electrode of the transistor is depleted. For example, in the N-channel MOS, the voltage applied to the gate electrode is made lower than the threshold voltage of the transistor, and a region below the gate electrode may thereby be caused to become the storage mode. However, in the protection transistor in which the drain is connected with the gate, a desired voltage may not be applied to the gate electrode from the outside. That is, the region may not be caused to become the storage mode by applying a desired voltage to the gate electrode. On the other hand, in a case where the depletion layer is formed under the gate electrode, the depletion layer under the gate electrode becomes a cause of the occurrence of the dark current. Accordingly, in view of restraining the dark current, it is advantageous to cause the protection transistor to become the storage mode without requesting the application of the voltage from the outside. In the configuration exemplified in FIG. 2, the reset transistor 26 also includes the n-type impurity region 67n as the drain (or the source). Accordingly, as for the reset transistor 26 also, it is advantageous to restrain formation of the depletion layer under the gate electrode 26e in a case where the reset transistor 26 is turned off.

The inventors found that the region below the gate electrode on the semiconductor substrate 60 might be caused to become the storage mode by controlling the application voltage to the gate electrode and the depletion layer under the gate electrode might be diminished. FIGS. 3 to 7 are examples of simulation results that represent changes in carrier concentrations under the gate electrode with respect to the change in a gate voltage of the N-channel MOS. The upper parts of FIGS. 3 to 7 represent the distributions of the positive holes in the semiconductor substrate. The lower parts of FIGS. 3 to 7 represent the distributions of electrons in the semiconductor substrate. In FIGS. 3 to 7, the hatched rectangles schematically indicate the position of the gate electrode. The same applies to FIG. 9, which will be described later. Here, it is assumed that a polysilicon electrode (dose amount: $2 \times 10^{12}/cm^2$) of the conductivity type of the n-type is used as the gate electrode. In FIGS. 3 to 7, a left side below the gate electrode is the source, and a right side below the gate electrode is the drain.

A region in which the densities of both of positive and negative carriers are low corresponds to the depletion layer. In FIGS. 3 to 7, arrow DL schematically indicates the width of the depletion layer in the vicinity of the surface of the semiconductor substrate. In FIGS. 3 to 7, bold solid lines DS indicate rough positions of the boundaries of the p-n junction. A commercially available process-device simulator is used for the simulation. Here, the application voltage to the source is set to 0.5 V, the application voltage to the drain is set to 2 V, and the thickness of the gate insulating layer is set to 9.5 nm.

FIGS. 3 to 7 respectively represent calculation results in cases where the application voltages to the gate electrode are set to 0.5, 0, −0.5, −1.0, and −1.5 V. It may be understood from FIGS. 3 to 7 that in a case where the polysilicon electrode of the conductivity type of the n-type is used as the gate electrode, the gate voltage is lowered to approximately −0.5 V, the positive holes are thereby attracted to a portion under the gate electrode, and the width of the depletion layer under the gate electrode may thereby be made almost zero.

Figure 8:
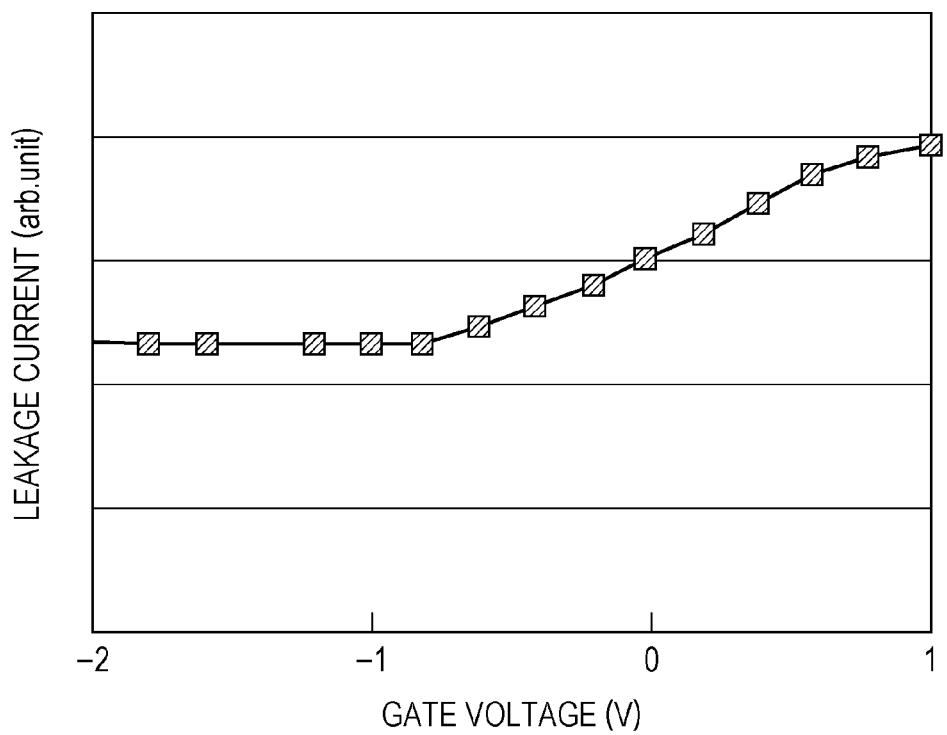
FIG. 8 is a graph that represents one example of a calculation result of the change in leakage current with respect to the change in the gate voltage.

FIG. 8 is a graph that represents one example of a calculation result of the magnitude change in the leakage current with respect to the change in the gate voltage. The horizontal axis in the graph illustrated in FIG. 8 represents the gate voltage (V), and the vertical axis represents the leakage current (arbitrary unit) per pixel cell in a logarithmic scale.

As it is understood from FIG. 8, the gate electrode is lowered to approximately −0.5 V, and the leakage current may thereby be reduced significantly. Further, it may be understood from FIGS. 3 to 7 that in a case where the polysilicon electrode of the conductivity type of the n-type is used as the gate electrode and where the gate voltage is lowered to approximately −0.5 V, the depletion layer under the gate electrode almost vanishes. In the embodiment of the present disclosure, when the imaging device 100 operates, the vertical scanning circuit 46 (see FIG. 1) supplies a negative voltage of approximately −1 V, for example, as a voltage for turning off the reset transistor 26 to the reset signal line 36. A negative voltage is used as the gate voltage for turning off the reset transistor 26, and it is thereby possible to restrain the formation of the depletion layer under the gate electrode 26e and to reduce the dark current due to the depletion layer under the gate electrode 26e.

Similarly, it is considered that a negative voltage is used as the gate voltage for turning off the protection transistor 28 and the formation of the depletion layer under the gate electrode 28e of the protection transistor 28 may thereby be restrained. However, as already described, the gate electrode 28e of the protection transistor 28 is electrically connected with the n-type impurity region 67n as the drain (or the source) via the connection portion 89 (see FIG. 2). Thus, the gate electrode 28e is at the same electric potential as the n-type impurity region 67n, and a negative voltage may not simply be used as the gate voltage for turning off the protection transistor 28.

As described with reference to FIG. 2, in the embodiment of the present disclosure, the polysilicon electrode of a different conductivity type from the conductivity type of the n-type impurity region 67n is used for the gate electrode 28e of the protection transistor 28. Accordingly, compared to a case where the polysilicon electrode of the conductivity type of the n-type is used, a work function of the gate electrode 28e may thereby be increased. In addition, it is possible to adjust the work function in the polysilicon electrode in accordance with the doping amount of impurities. Thus, as the work function of the polysilicon electrode, it is possible to obtain a higher value than the work function in the region under the gate electrode 28e of the semiconductor substrate 60. The work function in the polysilicon electrode is set higher than the work function in the semiconductor substrate 60 (here, the p-type impurity region 66p and the p-type semiconductor layer 65p), and an energy band diagram similar to the storage mode may thereby be obtained as an energy band diagram in the vicinity of the gate electrode 28e of the protection transistor 28. That is, a state similar to the storage mode may be realized without applying a specific voltage from the outside of the gate electrode 28e to the gate electrode 28e. Accordingly, the positive holes are attracted to a portion under the gate electrode 28e, and the width of the depletion layer under the gate electrode may thereby be made almost zero. Alternatively, it may be said that the work function in the polysilicon electrode is increased, the threshold voltage of the protection transistor 28 is thereby raised, and a state similar to the storage mode may thereby be realized. A detailed description will be made below about effects by causing the conductivity type of the gate electrode 28e of the protection transistor 28 to be different from the conductivity type of the n-type impurity region 67n with reference to FIGS. 9 to 11.

Figure 9:
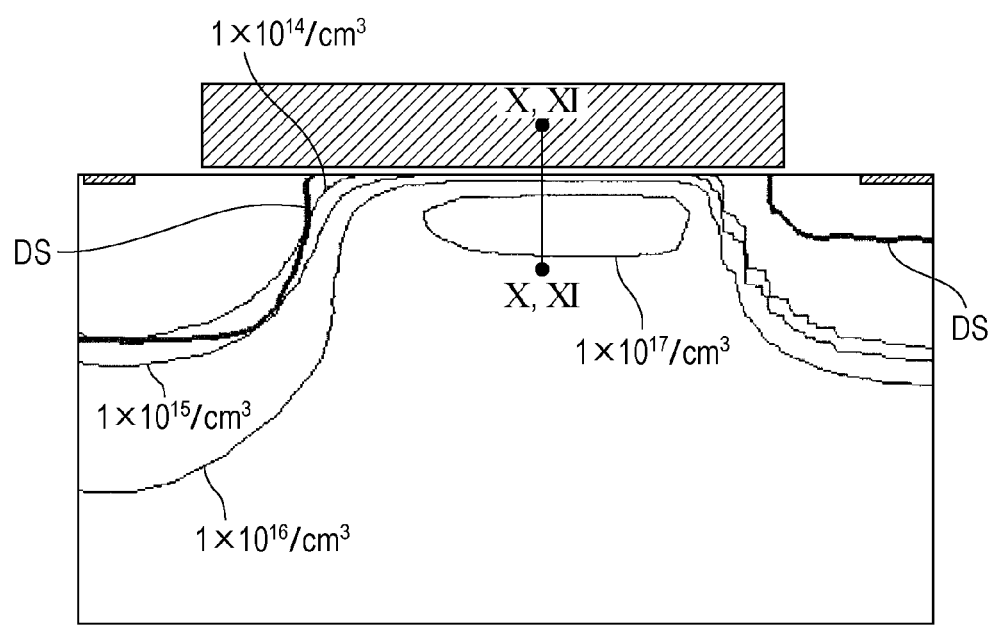
FIG. 9 is a contour diagram that illustrates one example of simulation results of positive hole densities under the gate electrode of the N-channel MOS that uses a polysilicon electrode of a conductivity type of a p-type as the gate electrode.

FIG. 9 illustrates one example of simulation results of positive hole densities under the gate electrode of the N-channel MOS that uses the polysilicon electrode of the conductivity type of the p-type as the gate electrode. Here, both of the gate voltage and the source voltage are set to 0.5 V, and the drain voltage is set to 2 V. That is, FIG. 9 corresponds to the simulation results in a case where the conductivity type of the gate electrode 28e of the protection transistor 28 is set as the p-type. The upper part of FIG. 3 corresponds to the simulation results in a case where the conductivity type of the gate electrode 28e of the protection transistor 28 is set as the n-type. Similarly to FIGS. 3 to 7, bold solid lines DS in FIG. 9 indicate rough positions of the boundaries of the p-n junction. As it is understood from FIG. 9, the polysilicon electrode of the conductivity type of the p-type is used as the gate electrode, the positive holes are thereby stored under the gate electrode, and the storage mode is realized.

Figure 3:
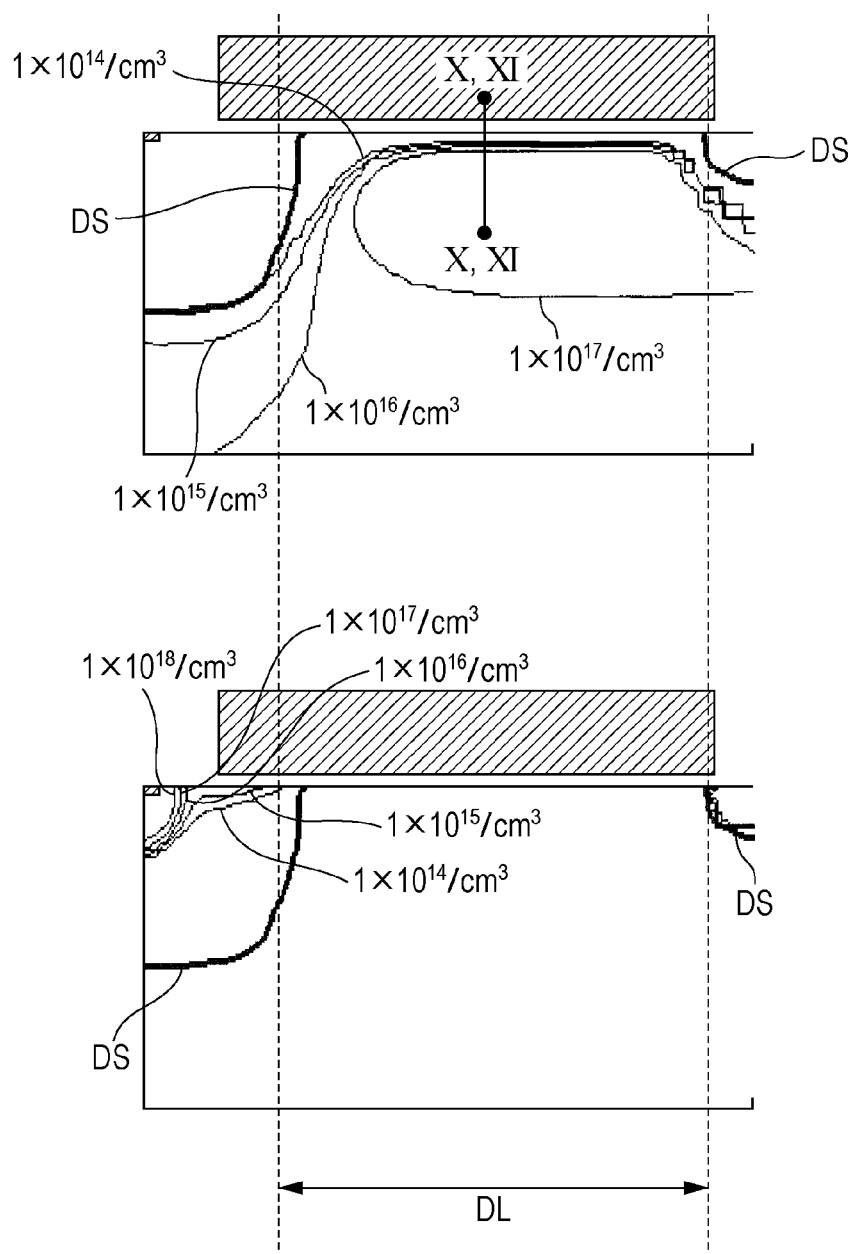
FIG. 3 is a contour diagram that illustrates simulation results of carrier concentrations under a gate electrode in a case where a gate voltage is set to +0.5 V in an N-channel MOS.
Figure 4:
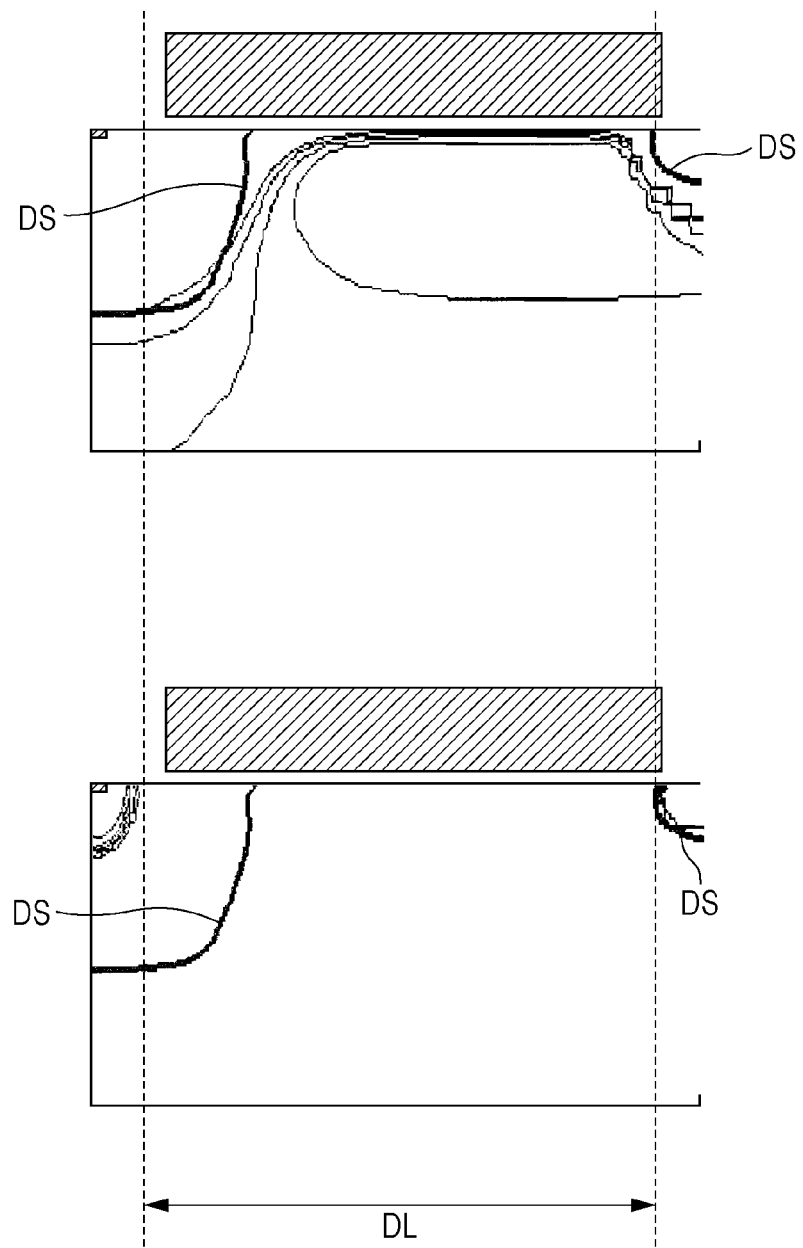
FIG. 4 is a contour diagram that illustrates simulation results of the carrier concentrations under the gate electrode in a case where the gate voltage is set to 0 V in the N-channel MOS.
Figure 5:
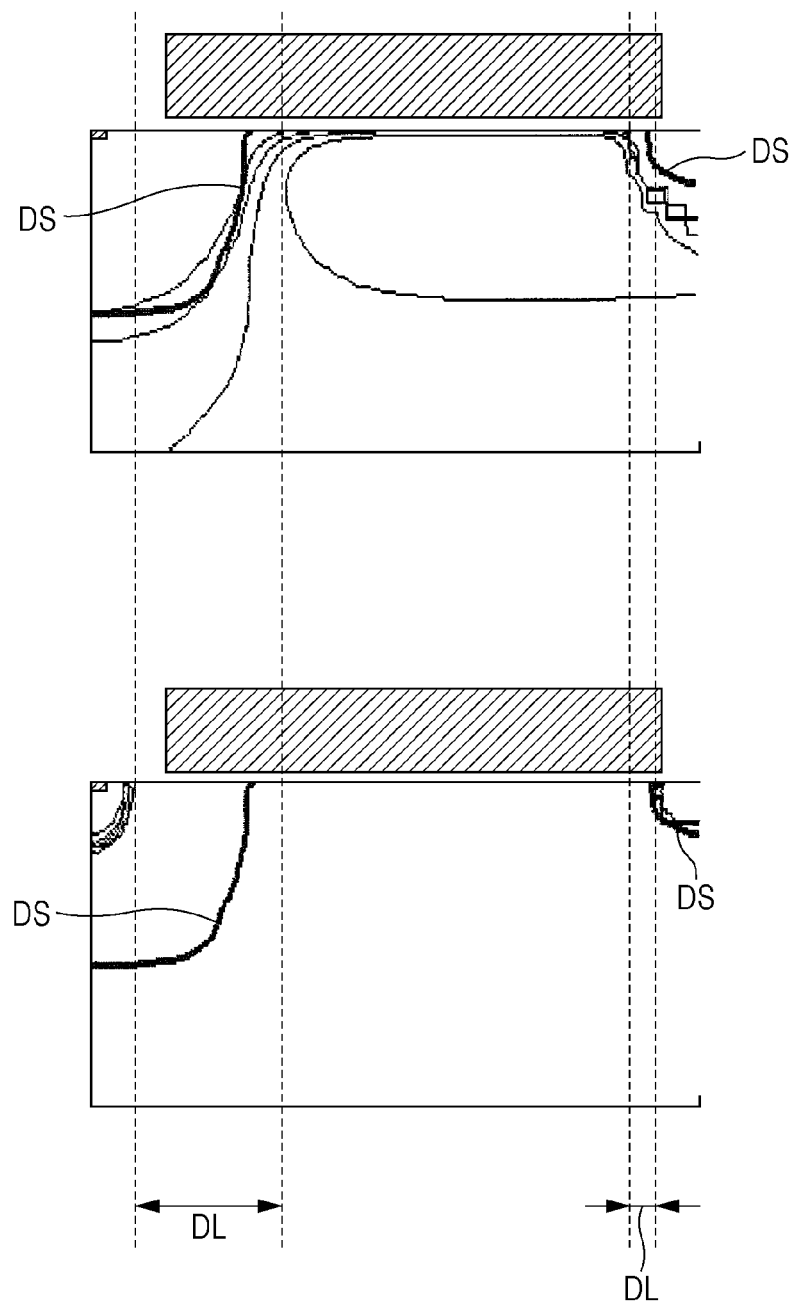
FIG. 5 is a contour diagram that illustrates simulation results of the carrier concentrations under the gate electrode in a case where the gate voltage is set to −0.5 V in the N-channel MOS.
Figure 6:
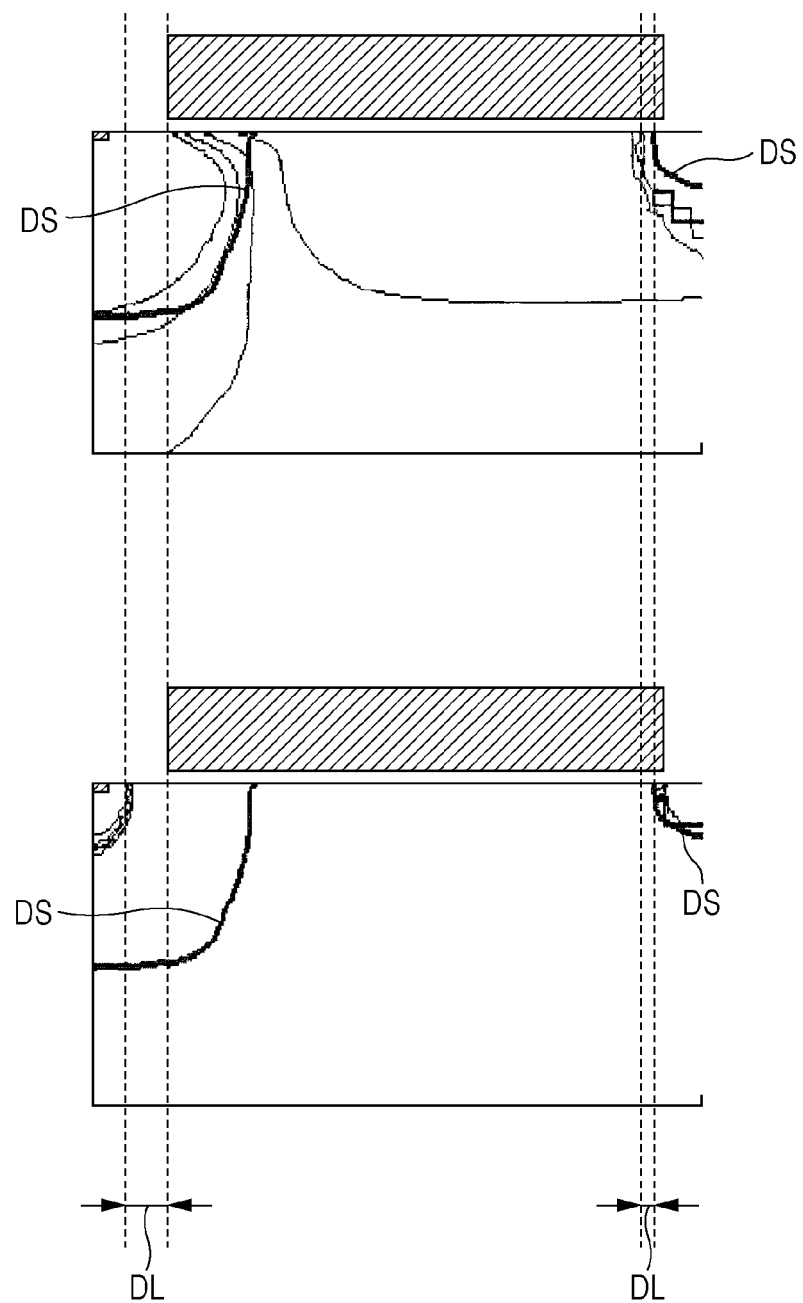
FIG. 6 is a contour diagram that illustrates simulation results of the carrier concentrations under the gate electrode in a case where the gate voltage is set to −1.0 V in the N-channel MOS.
Figure 7:
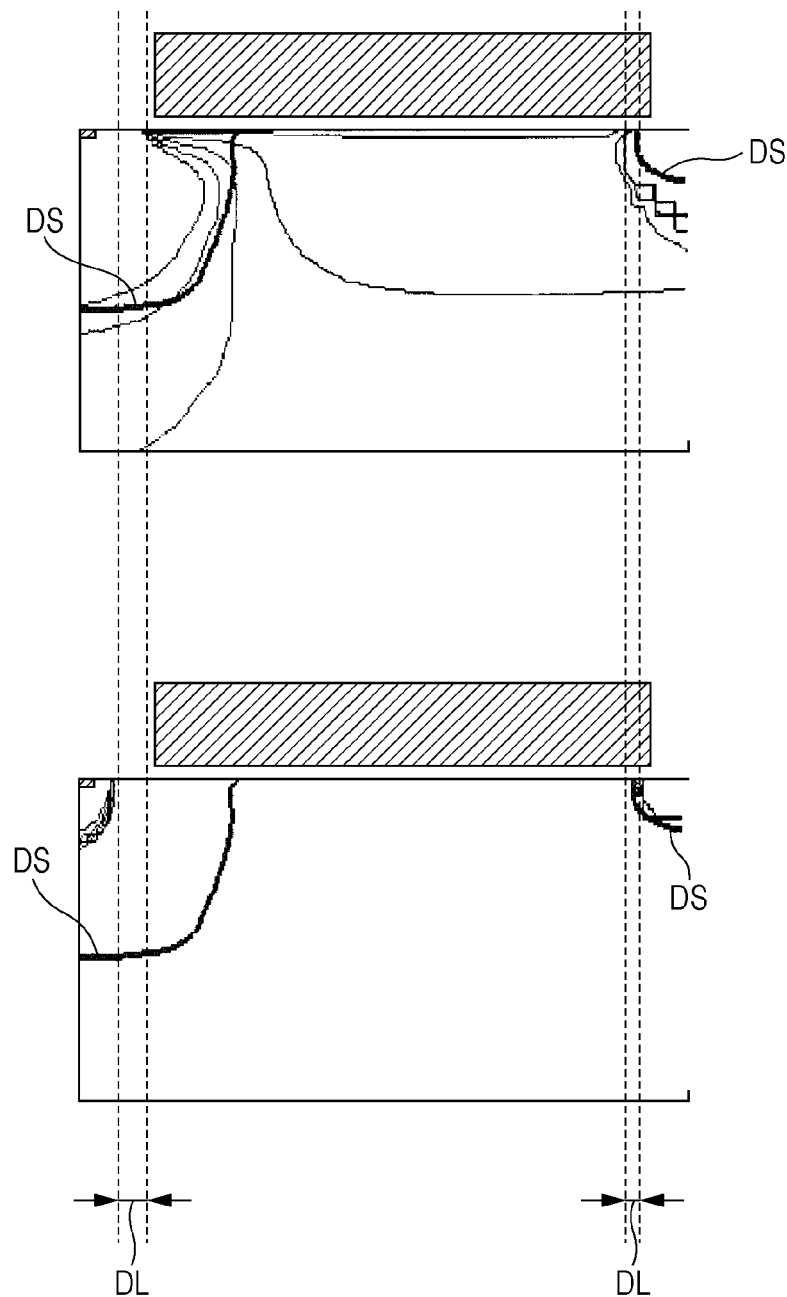
FIG. 7 is a contour diagram that illustrates simulation results of the carrier concentrations under the gate electrode in a case where the gate voltage is set to −1.5 V in the N-channel MOS.
Figure 10:
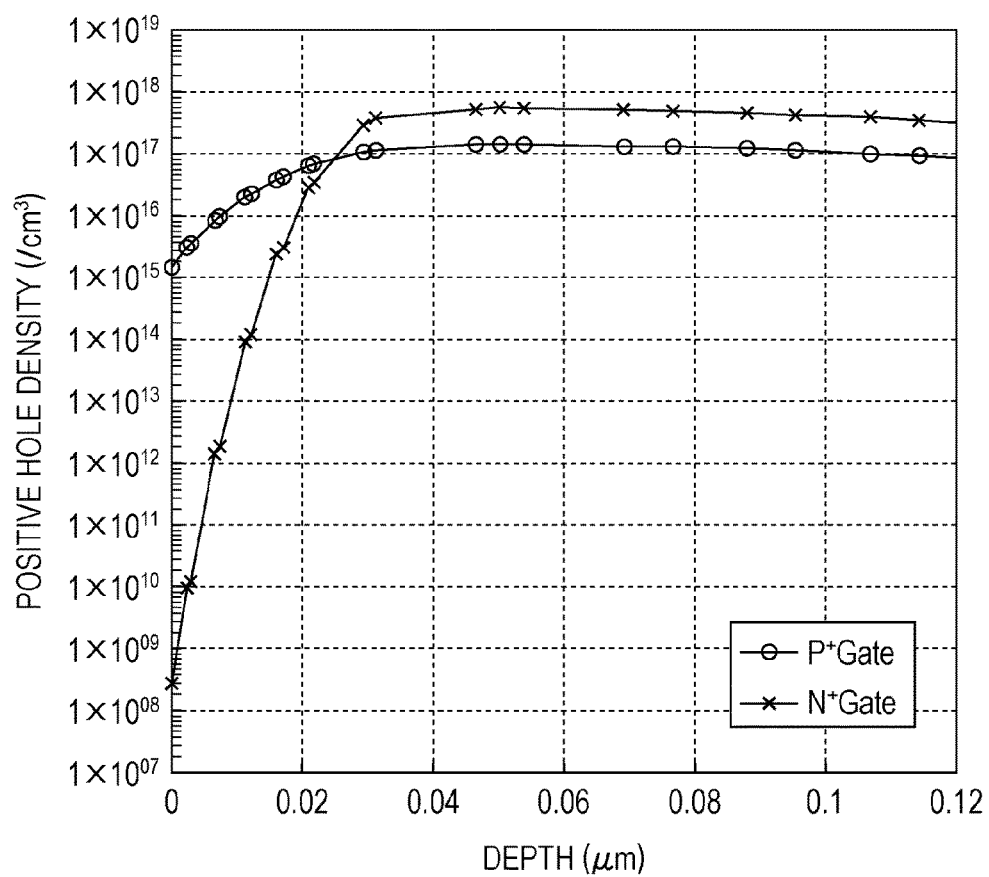
FIG. 10 is a graph that together represents the change in the positive hole density along line X-X indicated in FIG. 3 and the change in the positive hole density along line X-X indicated in FIG. 9.

FIG. 10 together represents the change in the positive hole density along line X-X indicated in FIG. 3 and the change in the positive hole density along line X-X indicated in FIG. 9. In FIG. 10, the horizontal axis represents the depth from the surface of the semiconductor substrate, and the vertical axis represents the positive hole density in a logarithmic scale. In the graph illustrated in FIG. 10, the plotted symbols of "○" indicate the positive hole densities along line X-X indicated in FIG. 9. Meanwhile, the plotted symbols of "x" indicate the positive hole densities along line X-X indicated in FIG. 3. It is understood from FIG. 10 that the polysilicon electrode of the conductivity type of the p-type is used as the gate electrode and the positive holes are thereby stored in a region in the vicinity of the surface of the semiconductor substrate.

Figure 11:
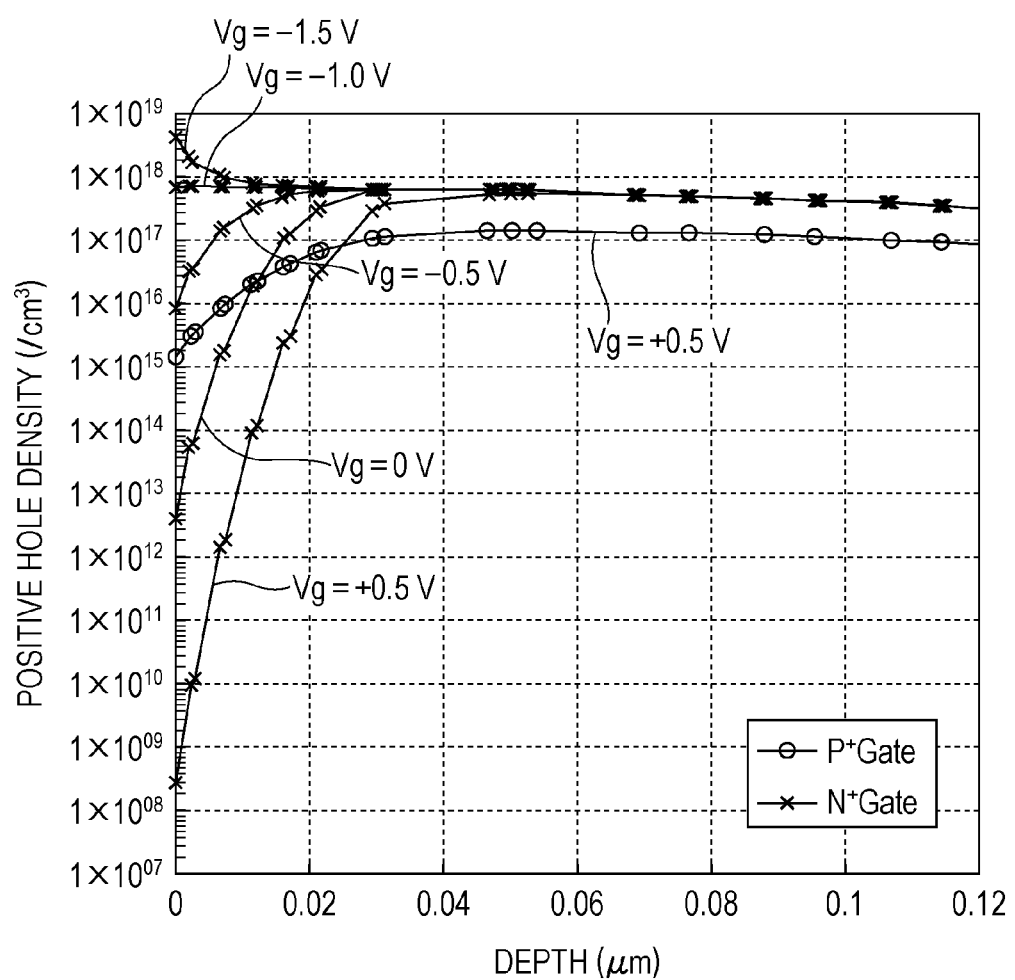
FIG. 11 is a graph that represents results of calculation of the dependence of the change in the positive hole density along line XI-XI indicated in FIG. 3 with respect to the gate voltage.

FIG. 11 represents results of calculation of the dependence of the change in the positive hole density along line XI-XI indicated in FIG. 3 with respect to a gate voltage Vg. FIG. 11 together illustrates the positive hole densities along line XI-XI indicated in FIG. 9 (the plotted symbols of "○"). It is understood from the comparison among FIGS. 3 to 8 and 9 and the calculation results indicated in FIG. 11 that the polysilicon electrode of the conductivity type of the p-type is used as the gate electrode and almost the same positive hole distribution as a case where the polysilicon electrode of the conductivity type of the n-type is used as the gate electrode and a voltage of approximately −0.5 to −1 V is applied to the gate electrode may thereby be obtained. That is, the polysilicon electrode of the conductivity type of the p-type is used as the gate electrode, and a similar effect to a case where the polysilicon electrode of the conductivity type of the n-type is used as the gate electrode and a voltage of approximately −0.5 to −1 V is applied to the gate electrode may thereby be obtained.

As described above, the polysilicon electrode of the conductivity type of the p-type is used as the gate electrode 28e of the protection transistor 28, and a similar state to a case where a negative voltage is actually applied to the gate electrode 28e may thereby be realized. In other words, a channel region of the protection transistor 28 is caused to become the storage mode, and the depletion layer may thereby be vanished. As a result, an effect of reducing the dark current may be obtained. Accordingly, in the embodiment of the present disclosure, while the damage to the unit pixel cell 10 in a case where an excessively high voltage is applied to the charge storage region is restrained, it is possible to restrain the formation of the depletion layer under the gate electrode 28e of the protection transistor 28 and to reduce the dark current. Reduction in the dark current restrains degradation of image quality.

Note that as the gate electrode 28e of the protection transistor 28, a material that has a similar work function to the polysilicon of the conductivity type of the p-type may be used. Here, the work function of $P^+$ polysilicon is 5.17 eV. Accordingly, as the gate electrode 28e, for example, $RuO_2$ (4.9 eV), WN (5.0 eV), Ir (5.35 eV), $Mo_2N$ (5.33 eV), TaN (5.43 eV), or Pt (5.65 eV) may be used. Further, a material that has a work function higher than $N^+$ polysilicon (4.05 eV) may provide a certain effect. That is, for example, Co (4.45 eV), Cr (4.5 eV), W (4.52 eV), Ru (4.68 eV), TiN (4.7 eV), or Pd (4.9 eV), which is referred to as so-called mid-gap metal, may be used. The work function of the material of the gate electrode 28e is desirably higher than 4.05 eV and more desirably 4.9 eV or higher to 6 eV or lower. An effect of reducing the leakage current may be obtained by using such materials.

Further, as a gate oxide film, for example, a high dielectric (high-k) material such as $HfO_2$ may be used.

In addition, in the example described with reference to FIGS. 1 and 2, the imaging device 100 is configured to be capable of applying a different voltage from the power source voltage VDD to the n-type impurity region 68en, which is the source (or the drain) of the protection transistor 28. As described below, when the imaging device 100 operates, for example, a lower voltage than the power source voltage VDD is supplied to the n-type impurity region 68en, and a more stable operation may thereby be realized in the protection transistor 28.

Figure 12:
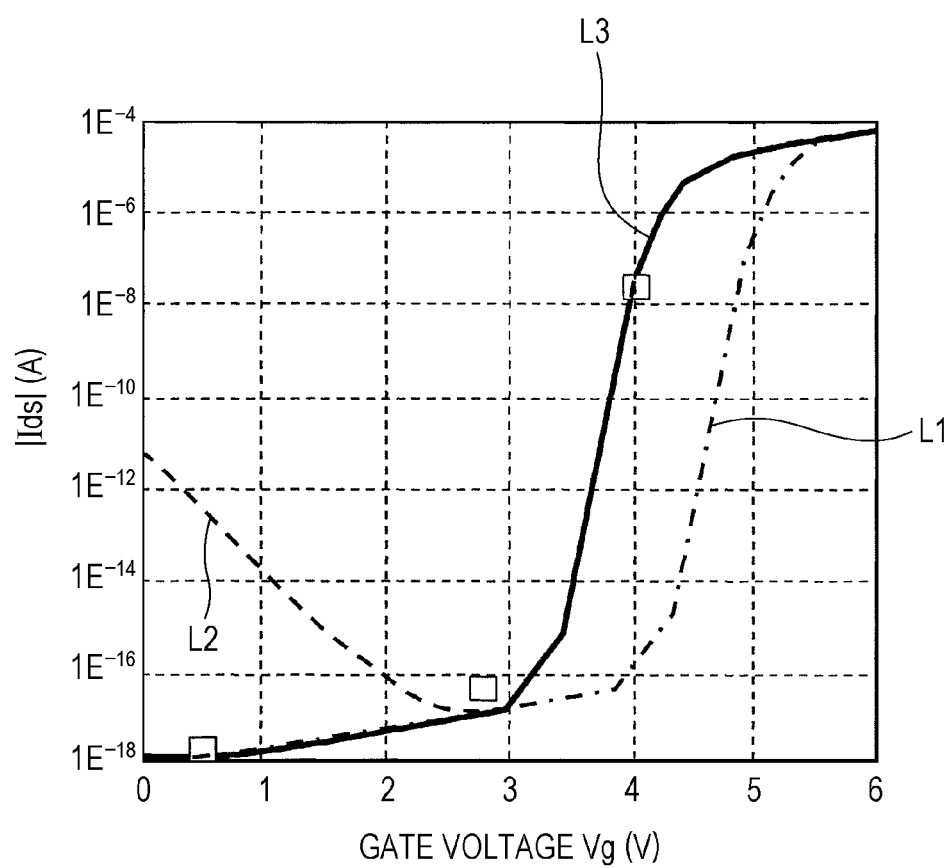
FIG. 12 is a graph that represents the relationship between a gate voltage Vg of a protection transistor and the absolute value |Ids| of the current between a source and a drain of the protection transistor.

FIG. 12 is a graph that represents the relationship between the gate voltage Vg of the protection transistor 28 and the absolute value |Ids| of the current that flows between the n-type impurity regions 67n and 68en of the protection transistor 28. Because the n-type impurity region 67n of the protection transistor 28 is at the same electric potential as the gate electrode 28e, it may be said that the horizontal axis of the graph illustrated in FIG. 12 represents the voltage that is applied to the n-type impurity region 67n of the protection transistor 28. Three blank rectangles in the graph indicate desirable operating points in the design of the protection transistor 28. In FIG. 12, one-dot chain line L1 and broken line L2 represent curves in a case where a voltage Vof that is applied to the n-type impurity region 68en of the protection transistor 28 (which may be considered as a voltage supplied to the charge recovery line 38) is equivalent to the power source voltage VDD (here, 3.3 V). Solid line L3 represents a curve in a case where a lower voltage (here, 2 V) than the power source voltage VDD is applied to the n-type impurity region 68en.

It is understood from the curve of L1 that in a case where the voltage Vof and the power source voltage VDD are set equivalent to each other, excessive charges are not discharged from the n-type impurity region 67n unless the gate voltage is comparatively high. That is, unless the electric potential of the charge storage region is comparatively high, excessive charges are not discharged from the charge storage region. For example, in order to inhibit electrical breakdown of the gate insulating layer 22g of the amplifier transistor 22, the thickness of the gate insulating layer 22g has to be made comparatively thick.

In a case where the thickness of the gate insulating layer 28g of the protection transistor 28 is made thick, the characteristic represented by the curve of L2 may be obtained even in a case where the voltage Vof is equivalent to the power source voltage VDD. The curve of L2 overlaps with the curve of L3 in the region in which the gate voltage Vg is 3 V or higher. It is understood that the thickness of the gate insulating layer 28g is made thick and excessive charges may thereby be discharged from the n-type impurity region 67n at a lower drain voltage. However, as it is understood from FIG. 12, in this case, |Ids| does not decrease even if the gate voltage Vg approaches zero, and off-leakage current occurs.

On the other hand, as represented by the curve of L3, a lower voltage than the power source voltage VDD is used as the voltage Vof, and excessive charges may thereby be discharged from the n-type impurity region 67n at a lower drain voltage while the off-leakage current is reduced. That is, it is possible to obtain a balance between cases where the protection transistor 28 is turned on and off. That is, a lower voltage than the power source voltage VDD supplied to the amplifier transistor 22 is supplied to the n-type impurity region 68en of the protection transistor 28, and a more stable operation in the protection transistor 28 may thereby be realized. Further, because the thickness of the gate insulating layer 28g of the protection transistor 28 does not have to be made thick in order to obtain a more stable operation in the protection transistor 28, the thickness of the gate insulating layer 28g of the protection transistor 28 does not have to be different from the thicknesses of the gate insulating layers of the other transistors in the unit pixel cell 10. Accordingly, for example, it is possible to together form the gate insulating layer 28g of the protection transistor 28 and the gate insulating layer 26g of the reset transistor 26 by a single kind of patterning of the insulating layer, and complication in the manufacturing process may be avoided. In a case where the gate insulating layer 28g and the gate insulating layer 26g are together formed by a single kind of patterning of the insulating layer, the thicknesses of those are almost the same. That is, the thickness of the gate insulating layer 28g may be equivalent to the thickness of the gate insulating layer 26g within a manufacturing error.

As described above, it is desirable that the voltage supplied to the n-type impurity region 68en of the protection transistor 28 is a different voltage from the power source voltage VDD and is a voltage on the same side as the reset voltage with respect to the power source voltage VDD.

Note that applying a lower voltage to the n-type impurity region 68en facilitates discharge of charges from the n-type impurity region 67n. However, because the leakage current is likely to flow during the charge storage in a case where the voltage Vof is 0 V, a lower limit of the voltage Vof is approximately 0.5 to 1 V. In a case where the voltage Vof is lower than the power source voltage VDD by at least approximately 0.5 V, the above-described stabilizing effect may be obtained.

The voltage Vof applied to the n-type impurity region 68en of the protection transistor 28 does not have to be fixed when the imaging device 100 operates. The voltage Vof applied to the n-type impurity region 68en is made variable, and a voltage, which serves as a reference of whether or not charges are discharged from the charge storage region via the protection transistor 28, may thereby be adjusted by using the voltage Vof. For example, in accordance with the operation mode of the imaging device 100 or the scene to be photographed, a configuration may be employed in which the voltage applied to the n-type impurity region 68en is dynamically changed.

Note that the above-described stabilizing effect is not limited to a case where the gate electrode 28e of the protection transistor 28 is the polysilicon of the conductivity type of the p-type. For example, also in a case where the gate electrode 28e is the polysilicon of the conductivity type of the n-type, a lower voltage than the power source voltage VDD supplied to the amplifier transistor 22 is supplied to the n-type impurity region 68en of the protection transistor 28, and a more stable operation in the protection transistor 28 may thereby be realized. That is, regardless of the material of the gate electrode 28e of the protection transistor 28, the above-described stabilizing effect may be obtained.

As described in the foregoing, in the embodiment of the present disclosure, an influence by the leakage current may be restrained, and an imaging device that is capable of performing imaging with a high image quality is thus provided. Each of the amplifier transistor 22, the address transistor 24, the reset transistor 26, and the protection transistor 28 may be the N-channel MOS or a P-channel MOS. In a case where the protection transistor 28 is the P-channel MOS, the conductivity type of the gate electrode 28e may be made the n-type, and "power source voltage VDD" may be replaced with "power source voltage VSS".

Further, all of those transistors do not have to be standardized with either one of the N-channel MOS and the P-channel MOS.

Between positive and negative charges that are generated by the photoelectric conversion, the negative charge may be used as the signal charge. In a case where the negative charge is used as the signal charge and the P-channel MOS is used as the protection transistor 28, the polysilicon of the conductivity type of the n-type may be used as the gate electrode 28e of the protection transistor 28. Accordingly, it is possible to restrain the formation of the depletion layer under the gate electrode 28e of the protection transistor 28 and to reduce the dark current. A material that has a similar work function to the polysilicon of the conductivity type of the n-type may be used as the gate electrode 28e of the protection transistor 28. Here, the work function of N$^+$ polysilicon is 4.05 eV. Accordingly, as the gate electrode 28e, for example, Hf (3.9 eV), TaN (4.05 eV), Al (4.13 eV), Ti (4.14 eV), Nb (4.15 eV), or Ta (4.19 eV) may be used. Further, a material that has a work function lower than P$^+$ polysilicon (5.17 eV) may provide a certain effect. That is, for example, the aforementioned mid-gap metal may be used. The work function of the material of the gate electrode 28e of the protection transistor 28 is desirably lower than 5.17 eV and more desirably 3.3 eV or higher to 4.2 eV or lower. In a case where the negative charge is used as the signal charge and the P-channel MOS is used as the protection transistor 28, an effect of reducing the leakage current may be obtained by using the aforementioned materials for the gate electrode 28e.

Further, in a case where the negative charge is used as the signal charge, a higher voltage than the power source voltage VDD (or the power source voltage VSS) supplied to the amplifier transistor 22 is supplied to the n-type (or p-type) impurity region 68en of the protection transistor 28. That is, the voltage supplied to the n-type (or p-type) impurity region 68en of the protection transistor 28 is a different voltage from the power source voltage VDD (or the power source voltage VSS) and is a voltage on the same side as the reset voltage with respect to the power source voltage VDD (or the power source voltage VSS). Accordingly, excessive charges may be discharged from the n-type (or p-type) impurity region 67n at a higher gate voltage while the off-leakage current is reduced. That is, a more stable operation in the protection transistor 28 may be realized. In this case also, regardless of the material of the gate electrode 28e of the protection transistor 28, the stabilizing effect may be obtained.

In a case where either one of positive and negative charges is used as the signal charge, the absolute value of the difference between the reset voltage and the voltage supplied to the n-type (or p-type) impurity region 68en of the protection transistor 28 may be smaller than the absolute value of the difference between the reset voltage and the power source voltage VDD (or the power source voltage VSS). Further, the voltage supplied to the n-type (or p-type) impurity region 68en of the protection transistor 28 may be a voltage between the reset voltage and the power source voltage VDD (or the power source voltage VSS).

The imaging device of the present disclosure is useful for image sensors, digital cameras, and so forth, for example. The imaging device of the present disclosure may be used for medical cameras, cameras for robots, security cameras, cameras that are installed in vehicles and used, and so forth.

What is claimed is:

1. An imaging device comprising:
a semiconductor layer; and
a pixel including
an impurity region of a first conductivity type, the impurity region being located in the semiconductor layer,
a photoelectric converter electrically connected to the impurity region, the photoelectric converter being located above the semiconductor layer,
a first transistor having a first gate, a first source and a first drain, one of the first source and the first drain being electrically connected to the impurity region,
a second transistor having a second gate of a second conductivity type different from the first conductivity type, a second source and a second drain, the second transistor including the impurity region as one of the second source and the second drain, the second gate being electrically connected to the impurity region, and
a third transistor having a third gate, a third source and a third drain, the third gate being electrically connected to the photoelectric converter.

2. The imaging device according to claim 1, wherein the first transistor includes the impurity region as the one of the first source and the first drain.

3. The imaging device according to claim 1, further comprising:
a first voltage supply circuit that supplies a first voltage,
a second voltage supply circuit that supplies a second voltage,
a first line through which the first voltage supply circuit supplies the first voltage to one of the third source and the third drain; and
a second line through which the second voltage supply circuit supplies a second voltage to the other of the second source and the second drain, wherein
the second voltage is different from the first voltage, and is on a same side as a reset voltage with respect to the first voltage, the reset voltage being a voltage for initializing a charge generated by the photoelectric converter.

4. The imaging device according to claim 1, wherein
the first transistor has a first gate insulating layer between the first gate and the semiconductor layer,
the second transistor has a second gate insulating layer between the second gate and the semiconductor layer, and
a thickness of the first gate insulating layer is equivalent to a thickness of the second gate insulating layer.

5. The imaging device according to claim 1, wherein
the pixel further includes a connector that electrically connects the second gate to the impurity region,
the impurity region includes a first region and a second region, a part of the second region being located on a surface of the semiconductor layer, the first region covering an underneath of the second region,
an impurity concentration of the second region is higher than an impurity concentration of the first region, and
the connector is in contact with the second region.

6. The imaging device according to claim 5, wherein the connector has a first plug, a second plug and a metal wiring layer, one end of the first plug being connected to the impurity region, one end of the second plug being connected to the second gate, the metal wiring layer electrically connecting the first plug to the second plug.

7. The imaging device according to claim 1, wherein the first gate is of the first conductivity type.

8. The imaging device according to claim 1, wherein the semiconductor layer is of the second conductivity type.

9. The imaging device according to claim 3, wherein an absolute value of a difference between the reset voltage and the second voltage is less than an absolute value of a difference between the reset voltage and the first voltage.

10. The imaging device according to claim 9, wherein the second voltage is a voltage between the reset voltage and the first voltage.

11. The imaging device according to claim 3, further comprising
   a first controller that causes the first voltage supply circuit to supply the first voltage, and
   a second controller that causes the second voltage supply circuit to supply the second voltage.

12. The imaging device according to claim 1, wherein the second gate is electrically connected to the impurity region via an electrical conductor, and the third gate is electrically connected to the photoelectric converter via an electrical conductor.

* * * * *